US012765283B2

(12) United States Patent
Kim et al.

(10) Patent No.: US 12,765,283 B2
(45) Date of Patent: Oct. 13, 2026

(54) METHOD OF MANUFACTURING INTEGRATED CIRCUIT DEVICE

(71) Applicant: SAMSUNG ELECTRONICS CO., LTD., Suwon-si (KR)

(72) Inventors: Joonyoung Kim, Suwon-si (KR); Dohyun Kim, Yongin-si (KR); Sechan Kim, Yongin-si (KR); Kijong Park, Suwon-si (KR); Yuri Park, Yongin-si (KR); Sunjoong Song, Suwon-si (KR); Eunjin Song, Yongin-si (KR); Seungmin Shin, Suwon-si (KR); Seungcheol Chae, Suwon-si (KR); Sangjoon Park, Yongin-si (KR); Hyunjin Jang, Yongin-si (KR)

(73) Assignees: SAMSUNG ELECTRONICS CO., LTD., Suwon-si (KR); TES Co., Ltd, Yongin-si (KR)

( * ) Notice: Subject to any disclaimer, the term of this patent is extended or adjusted under 35 U.S.C. 154(b) by 343 days.

(21) Appl. No.: 18/652,323

(22) Filed: May 1, 2024

(65) Prior Publication Data

US 2025/0079154 A1 Mar. 6, 2025

(30) Foreign Application Priority Data

Sep. 1, 2023 (KR) ........................ 10-2023-0116274

(51) Int. Cl.
*H10P 14/692* (2026.01)
*H10B 41/27* (2023.01)
(Continued)

(52) U.S. Cl.
CPC ........ *H10P 14/693* (2026.01); *H10P 14/6339* (2026.01); *H10P 14/69215* (2026.01); *H10P 50/287* (2026.01)

(58) Field of Classification Search
CPC ........ H10B 41/35; H10B 41/27; H10B 43/27; H10B 43/35; H10P 14/6339; H10P 14/6512; H10P 14/6529
See application file for complete search history.

(56) References Cited

U.S. PATENT DOCUMENTS

| | | | | |
|---|---|---|---|---|
| 6,432,779 | B1 * | 8/2002 | Hobbs | H10D 64/01306 257/E21.252 |
| 9,412,861 | B2 | 8/2016 | Oh et al. | |

(Continued)

FOREIGN PATENT DOCUMENTS

| | | | |
|---|---|---|---|
| KR | 10-2010-0071961 | A | 6/2010 |
| KR | 10-1536174 | B1 | 7/2015 |
| KR | 10-1623462 | B1 | 5/2016 |

OTHER PUBLICATIONS

Lee, et al., “Selectivity in Thermal Atomic Layer Etching Using Sequential, Self-Limiting Fluorination and Ligand-Exchange Reactions”, in American Chemical Society, Oct. 4, 2016, DOI: 10.1021/acs.chemmater.6b02543, pp. 7657-7665.

(Continued)

*Primary Examiner* — Sonya McCall-Shepard
(74) *Attorney, Agent, or Firm* — Morgan, Lewis & Bockius LLP

(57) ABSTRACT

A method of manufacturing an integrated circuit device includes forming a hafnium oxide film on a substrate and partially etching the hafnium oxide film. Partially etching the hafnium oxide film includes performing a dry treatment that changes components of a surface region that extends from an exposed surface of the hafnium oxide film into the hafnium oxide film by as much as a predetermined thickness by isotropically exposing the hafnium oxide film to a gas mixture that includes a halogen element-containing gas and a catalytic gas that includes hydrogen atoms in an atmosphere in which no plasma is applied onto the substrate, (Continued)

performing a wet treatment with an acidic solution that at least partially removes the component-changed surface region from the hafnium oxide film, and repeating a sequence of the dry treatment and the wet treatment.

20 Claims, 26 Drawing Sheets

(51) Int. Cl.

| | |
|---|---|
| ***H10B 41/35*** | (2023.01) |
| ***H10B 43/27*** | (2023.01) |
| ***H10B 43/35*** | (2023.01) |
| ***H10P 14/60*** | (2026.01) |
| ***H10P 50/28*** | (2026.01) |

(56) References Cited

U.S. PATENT DOCUMENTS

| | | | | |
|---|---|---|---|---|
| 11,637,242 | B2 | 4/2023 | Voronin et al. | |
| 2008/0217294 | A1 | 9/2008 | Ko et al. | |
| 2010/0186774 | A1 | 7/2010 | Miya et al. | |
| 2014/0187052 | A1* | 7/2014 | Nowling .......... | H10D 64/01326 438/756 |

OTHER PUBLICATIONS

Lee, et al., "Thermal atomic layer etching of HfO2 using HF for fluorination and TiCI4 for ligand-exchange", in J. Vac. Sci. Technol. A, vol. 36, No. 6, Nov./Dec. 2018, found on the internet at https://doi.org/10.1116/1.5045130, 9 pages.

Lee, et al., "Thermal Atomic Layer Etching of Al203, HfO2, and ZrO2 Using Sequential Hydrogen Flouride and Dimethylaluminum Chloride Exposures", in J. Phys. Chem. C 2019, 123, DOI:10,1021/acs.jpcc.9b04767, pp. 18455-18466.

Murdzek, et al., "Effect of crystallinity on thermal atomic layer etching of hafnium oxide, zirconium oxide, and hafnium zirconium oxide", in J. Vac. Sci. Technol. A 38, 022608 (2020), doi: 10.1116/1.5135317, Feb. 19, 2020, 8 pages.

Lee, et al., "Atomic Layer Etching of HfO2 Using Sequential, Self-Limiting Thermal Reactions with Sn(acac)2 and HF", in ECS Journal of Solid State Science and Technology, 4 (6) N5013-N5022 (2015), DOI: 10.1149/2.0041506jss, Mar. 12, 2015, 10 pages.

* cited by examiner

METHOD OF MANUFACTURING INTEGRATED CIRCUIT DEVICE

CROSS-REFERENCE TO RELATED APPLICATION

This application claims priority under 35 U.S.C. § 119 from Korean Patent Application No. 10-2023-0116274, filed on Sep. 1, 2023 in the Korean Intellectual Property Office, the contents of which are herein incorporated by reference in their entirety.

TECHNICAL FIELD

Embodiments of the inventive concept are directed to a method of manufacturing an integrated circuit device, and more particularly, to a method of manufacturing an integrated circuit device that includes a hafnium oxide film.

DISCUSSION OF THE RELATED ART

Along with the rapid down-scaling of integrated circuit devices, integrated circuit devices need high speed and accurate operations as well. Therefore, there is an increasing interest in hafnium oxide films that can provide high dielectric characteristics even with extremely low thicknesses, such as those of dielectric films of capacitors or gate insulating films. In addition, along with the increasing amount of information to be processed by using integrated circuit devices, techniques of integrating unit devices on 2-dimensional planes have are size limits. Therefore, 3-dimensional array structures in which a plurality of 2-dimensional arrays are vertically stacked are being studied. When hafnium oxide films are used in 3-dimensional array structures, techniques of patterning hafnium oxide films, which have various shapes within complex 3-dimensional-shape structures, are desired.

SUMMARY

Embodiments of the inventive concept provide a method of manufacturing an integrated circuit device, where the method includes a process patterning hafnium oxide films into intended shapes, even when components in reduced area device regions have complex 3-dimensional shapes and the hafnium oxide films have various shapes within 3-dimensional structures.

According to an embodiment of the inventive concept, there is provided a method of manufacturing an integrated circuit device that includes forming a hafnium oxide film on a substrate and etching a portion of the hafnium oxide film. Etching the portion of the hafnium oxide film includes performing a dry treatment that changes components of a surface region of the hafnium oxide film by isotropically exposing the hafnium oxide film to a gas mixture that includes a halogen element-containing gas and a catalytic gas that includes hydrogen atoms in an atmosphere in which no plasma is applied onto the substrate, where the surface region extends from an exposed surface of the hafnium oxide film into the hafnium oxide film by as much as a predetermined thickness, performing a wet treatment with an acidic solution that removes at least a portion of the component-changed surface region from the hafnium oxide film, and repeating a sequence of the dry treatment and the wet treatment.

According to another embodiment of the inventive concept, there is provided a method of manufacturing an integrated circuit device that includes forming, on a substrate, a stack structure that includes a plurality of hafnium oxide films and a plurality of intermediate films that are alternately arranged in a vertical direction, forming an opening that passes through the stack structure in the vertical direction, and etching a portion of each of the plurality of hafnium oxide films exposed by the opening. Etching the portion of each of the plurality of hafnium oxide films includes performing a dry treatment that changes components of a surface region of each of the plurality of hafnium oxide films by isotropically exposing each of the plurality of hafnium oxide films exposed by the opening to a gas mixture that includes a halogen element-containing gas and a catalytic gas that includes hydrogen atoms in an atmosphere in which no plasma is applied onto the substrate, where the surface region extends from an exposed surface of each of the plurality of hafnium oxide films into each of the plurality of hafnium oxide films by as much as a predetermined thickness, performing a wet treatment with an acidic solution that removes at least a portion of the component-changed surface region from each of the plurality of hafnium oxide films, and forming an indent space that extends in a horizontal direction between the plurality of intermediate films and is connected with the opening, by repeating a sequence of the dry treatment and the wet treatment.

According to another embodiment of the inventive concept, there is provided a method of manufacturing an integrated circuit device that includes alternately stacking a plurality of insulating films and a plurality of sacrificial insulating films on a substrate, forming a vertical hole that extends in a vertical direction through the plurality of insulating films and the plurality of sacrificial insulating films, sequentially forming a hafnium oxide film, a channel layer, and an insulating plug on exposed surfaces in the vertical hole, forming a plurality of gate spaces by removing the plurality of sacrificial insulating films, etching portions of the hafnium oxide film through the plurality of gate spaces to expand each of the plurality of gate spaces in a horizontal direction, and forming a plurality of gate lines that respectively fill the plurality of gate spaces. Etching the portions of the hafnium oxide film includes performing a dry treatment to change components of a surface region of the hafnium oxide film by isotropically exposing the hafnium oxide film to a gas mixture that includes a halogen element-containing gas and a catalytic gas that includes hydrogen atoms in an atmosphere in which no plasma is applied onto the substrate, where the surface region extends from an exposed surface of the hafnium oxide film into the hafnium oxide film by as much as a predetermined thickness, performing a wet treatment with an acidic solution that removes at least a portion of the component-changed surface region from the hafnium oxide film, and repeating a sequence of the dry treatment and the wet treatment.

DETAILED DESCRIPTION

Figure 1:
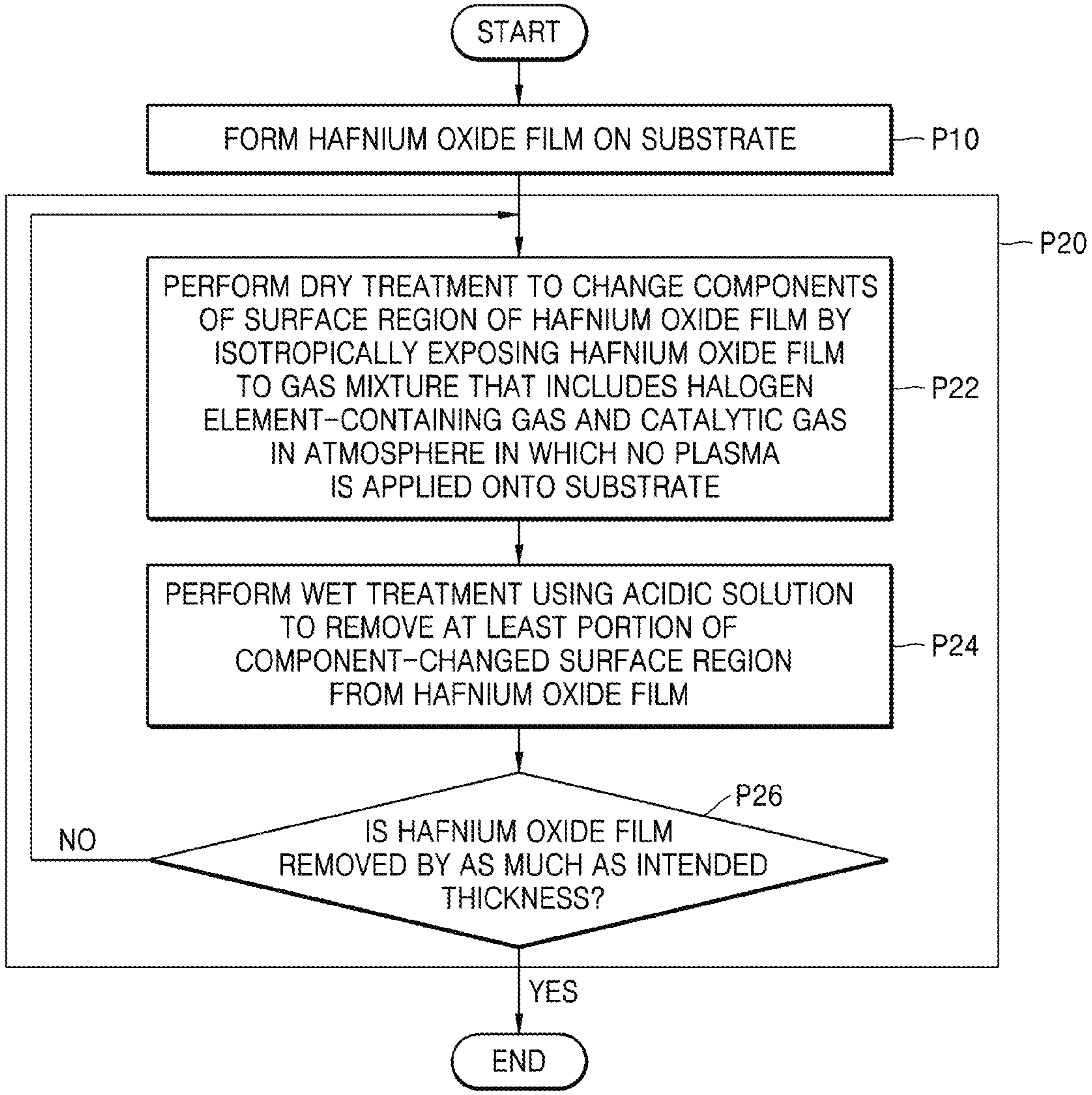
FIG. 1 is a flowchart of a method of manufacturing an integrated circuit device, according to some embodiments.

Hereinafter, embodiments of the inventive concept will be described in detail with reference to the accompanying drawings. Like components may be denoted by like reference numerals throughout the specification, and repeated descriptions thereof may be omitted.

The term "about" as used herein is inclusive of the stated value and means within an acceptable range of deviation for the particular value as determined by one of ordinary skill in the art, considering the measurement in question and the error associated with measurement of the particular quantity, such as the limitations of the measurement system. For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Figure 2A:
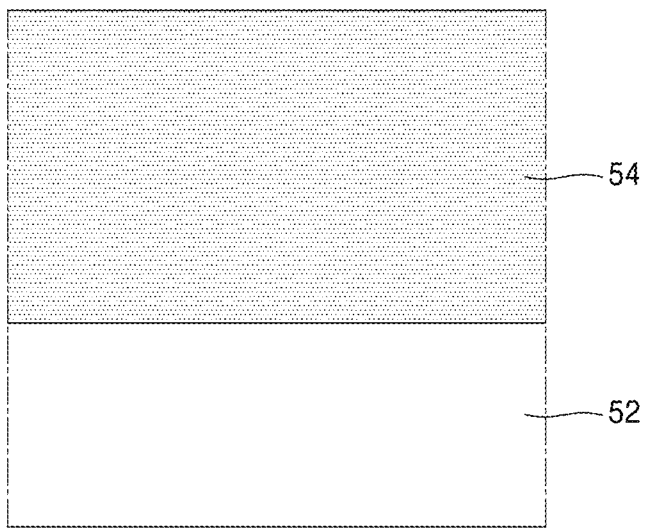
FIGS. 2A to 2C are cross-sectional views that illustrate a sequence of processes of a method of manufacturing an integrated circuit device, according to some embodiments.
Figure 2B:
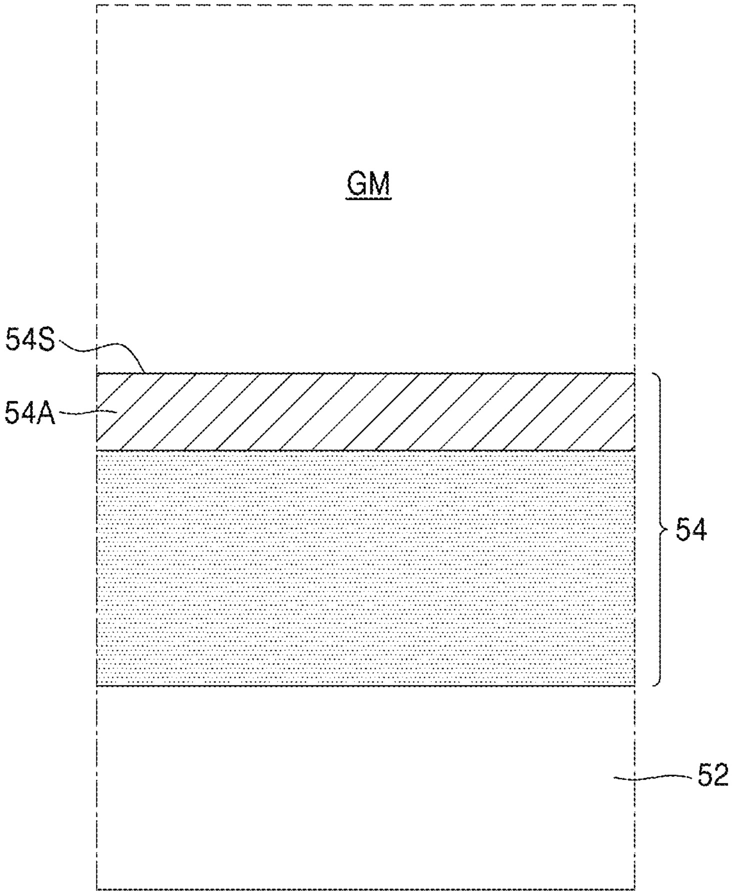
Figure 2C:
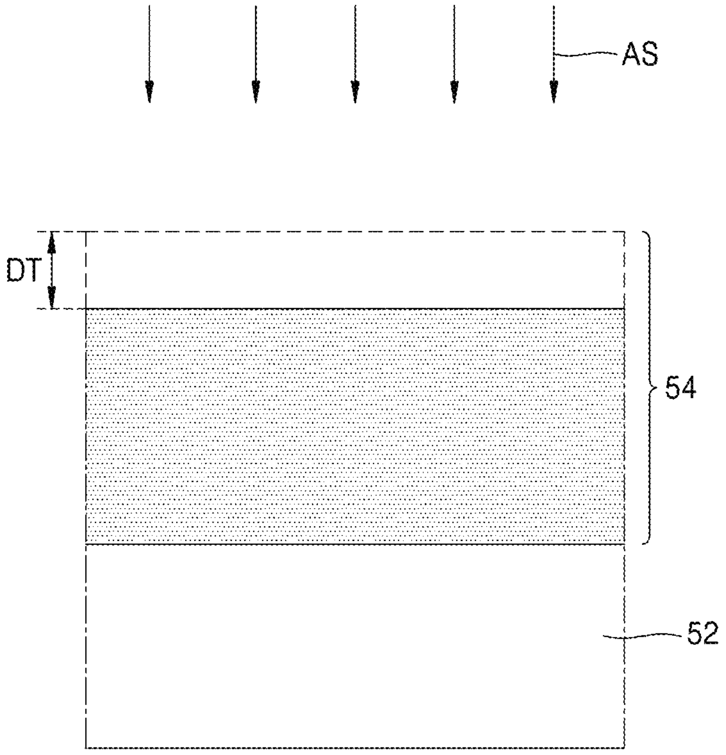

FIG. 1 is a flowchart of a method of manufacturing an integrated circuit device, according to some embodiments. FIGS. 2A to 2C are cross-sectional views that illustrating a sequence of processes of a method of manufacturing an integrated circuit device, according to some embodiments.

Referring to FIGS. 1 and 2A, in some embodiments, in process P10, a hafnium oxide film 54 is formed on a substrate 52.

The substrate 52 includes a semiconductor substrate that includes a semiconductor, such as Si or Ge, or a compound semiconductor, such as SiGe, SiC, GaAs, InAs, or InP. The substrate 52 may include a conductive region. The conductive region may include an impurity-doped well, an impurity-doped structure, or a conductive layer. The substrate 52 includes a lower structure formed on the semiconductor substrate. The lower structure includes an insulating film that includes one of a silicon oxide film, a silicon nitride film, or a combination thereof. In some embodiments, the lower structure includes various conductive regions, such as wiring layers, contact plugs, and transistors, and insulating patterns that insulate these components from each other.

In some embodiments, the hafnium oxide film 54 includes a $HfO_2$ film. In some embodiments, the hafnium oxide film 54 has an orthorhombic crystal phase or a monoclinic crystal phase.

Referring to FIGS. 1, 2B, and 2C, in some embodiments, in process P20, a portion of the hafnium oxide film 54 is etched.

A process of etching the portion of the hafnium oxide film 54 is as follows. In process P22 of FIG. 1, as shown in FIG. 2B, in an atmosphere in which no plasma is applied onto the substrate 52, the hafnium oxide film 54 is isotropically exposed to a gas mixture GM that includes a halogen element-containing gas and a catalytic gas that includes hydrogen atoms, thereby performing a dry treatment to change components of a surface region 54A that extends from an exposed surface of the hafnium oxide film 54 by as much as a predetermined thickness into the hafnium oxide film 54.

In some embodiments, in performing a dry treatment of process P22 of FIG. 1, the halogen element-containing gas includes fluorine (F) atoms or chlorine (Cl) atoms. For example, the halogen element-containing gas includes, but is not limited to, HF gas, F radicals, or HCl gas. When the F radicals are used as the halogen element-containing gas, the F radicals are generated by using a remote plasma generator outside and connected to a reaction chamber in which the substrate 52 is loaded, and the F radicals in the remote plasma generator are supplied onto the substrate 52 in the reaction chamber.

In some embodiments, in performing a dry treatment of process P22 of FIG. 1, the catalytic gas includes at least one of $NH_3$, $H_2O$, ethanol, isopropyl alcohol, or a combination thereof.

Figure 3:
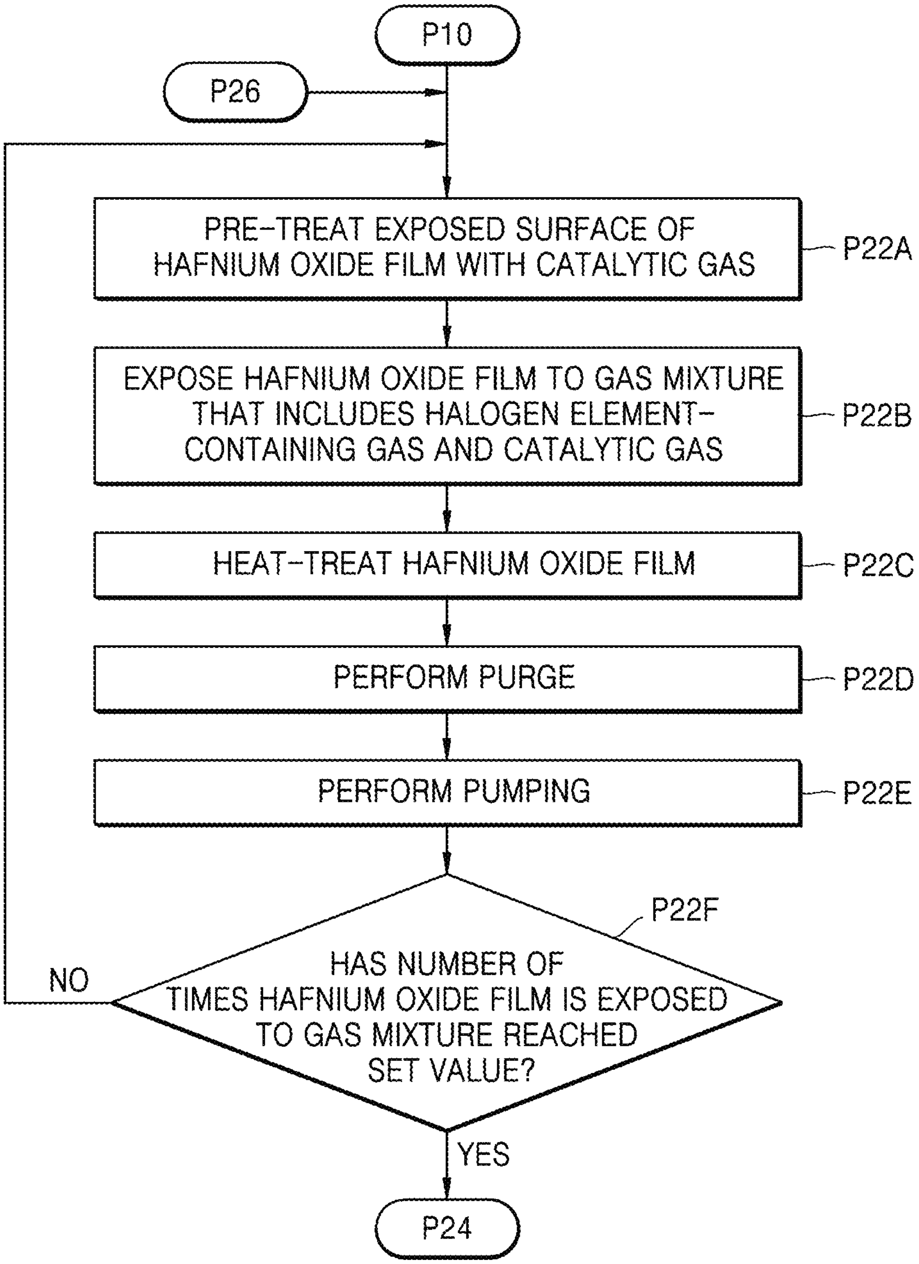
FIG. 3 is a flowchart of a process of changing components of a surface region of a hafnium oxide film in a method of manufacturing an integrated circuit device, according to some embodiments.

FIG. 3 is a flowchart of processes of performing a dry treatment of process P22 of FIG. 1 to change the components of the surface region 54A.

Referring to FIGS. 2B and 3, in some embodiments, in process P22A of FIG. 3, an exposed surface 54S of the hafnium oxide film 54 is pre-treated with the catalytic gas that includes hydrogen atoms. By pre-treating the exposed surface 54S of the hafnium oxide film 54 with the catalytic gas, a constituent material of the catalytic gas, such as $NH_3$, is physiosorbed onto the exposed surface 54S of the hafnium oxide film 54. Because the constituent material of the catalytic gas is physiosorbed on the exposed surface 54S of the hafnium oxide film 54, when the hafnium oxide film 54 is exposed to the gas mixture GM in a subsequent process, a chemical reaction that changes components of the surface region 54A of the hafnium oxide film 54 is accelerated. In some embodiments, the pre-treatment process of process P22A of FIG. 3 is performed for about 2 seconds to about 20 seconds, such as about 10 seconds.

In process P22B of FIG. 3, the hafnium oxide film 54 is exposed to the gas mixture GM that includes the halogen element-containing gas and the catalytic gas. The process P22B of FIG. 3 of exposing the hafnium oxide film 54 to the gas mixture GM is performed for about 30 seconds to about 90 seconds, such as about 50 seconds to about 70 seconds, or about 60 seconds.

Because the hafnium oxide film 54 is exposed to the gas mixture GM, the components of the surface region 54A of the hafnium oxide film 54 are changed. In some embodiments, when the halogen element-containing gas includes HF gas and the catalytic gas includes $NH_3$ gas and when the hafnium oxide film 54 is exposed to the gas mixture GM, the surface region 54A of the hafnium oxide film 54 is fluorinated. The fluorinated surface region 54A has a structure of a hafnium oxide film doped with F.

The processes of performing the pre-treatment of process P22A of FIG. 3 and exposing the hafnium oxide film 54 to the gas mixture GM of process P22B of FIG. 3 are each performed at a temperature in a range of about 40° C. to about 120° C. and at pressure in a range of about 0.1 Torr to about 3 Torr.

In process P22C of FIG. 3, the hafnium oxide film 54 that includes the fluorinated surface region 54A is heat-treated.

The heat treatment is performed at a temperature in a range of about 100° C. to about 200° C. In some embodiments, the heat treatment is performed by using a lamp or a heater. For example, the lamp includes one or more halogen lamps.

In process P22D of FIG. 3, after the hafnium oxide film 54 is heat-treated, an atmosphere inside the reaction chamber in which the substrate 52 is loaded is purged. The purge is performed by supplying an inert gas, such as nitrogen ($N_2$) gas or argon (Ar) gas, onto the substrate 52.

In process P22E of FIG. 3, the atmosphere purged in process P22D of FIG. 3 is pumped out, thereby discharging by-products and gases from the reaction chamber in which the substrate 52 is loaded.

In process P22F of FIG. 3, it is determined whether a sequence of process P22A, process P22B, process P22C, process P22D, and process P22E has been performed a preset number of times, and the sequence of processes P22A, P22B, P22C, P22D, and P22E may be repeated once or a plurality of times, as needed. In some embodiments, the preset number of times is, but is not limited to, in a range of 1 to 30, as needed.

Referring again to FIGS. 1, 2B, and 2C, in an embodiment, in process P24, a wet treatment is performed that removes at least a portion of the component-changed surface region 54A from the hafnium oxide film 54 by using an acidic solution AS.

The acidic solution AS includes, but is not limited to, at least one of diluted HF (DHF), a sulfuric acid peroxide mixture (SPM), diluted HCl, or a combination thereof. The DHF is a solution in which an HF solution with a purity of 50% (50 wt % HF in water) and water are mixed with each other in a volume ratio of about 1:30 to about 1:300. The SPM is a solution in which sulfuric acid ($H_2SO_4$) and hydrogen peroxide ($H_2O_2$) are mixed with each other in a volume ratio of about 2:1 to about 100:1. The diluted HCl is a solution in which HCl and water are mixed with each other in a volume ratio of about 1:10 to about 1:100. In some embodiments, the acidic solution AS includes a mixed solution of the DHF and the SPM.

The process of performing the wet treatment of process P24 of FIG. 1 is performed at a temperature that is lower than that of the process of performing the dry treatment of process P22 of FIG. 1. In some embodiments, the process of performing the wet treatment of process P24 of FIG. 1 is performed at a temperature in a range of about 10° C. to about 70° C.

As a result of performing the wet treatment of process P24 of FIG. 1, at least a portion of the component-changed surface region 54A is removed from the hafnium oxide film 54. A thickness DT of the surface region 54A from the exposed surface 54S of the hafnium oxide film 54 that is removed from the hafnium oxide film 54 due to the wet treatment is about 0.1 Å to about 20 Å.

In process P26 of FIG. 1, it is determined whether the hafnium oxide film 54 has been removed to an intended thickness. When it is determined that the hafnium oxide film 54 is not removed to the intended thickness, a sequence of processes P22, P24, and P26 are repeated once or a plurality of times, as needed. In process P26, when it is determined that the hafnium oxide film 54 is removed to the intended thickness, the etching process of the hafnium oxide film 54 is terminated.

In general, because a crystallized hafnium oxide film tends to be chemically inert, when existing etching processes that are widely used in the art are used, the crystallized hafnium oxide film might not be etched well or it may be challenging to secure etch selectivity between the crystallized hafnium oxide film and other films around the crystallized hafnium oxide film. In addition, in integrated circuit devices, such as dynamic random access memory (DRAM) devices, flash memory devices, and logic devices, 3-dimensional structures have been introduced to overcome a limit in fine processes. Therefore, there is a need to remove a hafnium oxide film exposed at surfaces over the substrate 52, regardless of an etching direction by using an isotropic etching process instead of an anisotropic etching process that is performed in a perpendicular direction to a main surface of the substrate 52.

According to embodiments of the inventive concept, the dry treatment is performed to change the components of the surface region 54A that extends from the exposed surface 54S of the hafnium oxide film 54 by as much as a predetermined thickness into the hafnium oxide film 54, by isotropically exposing the hafnium oxide film 54 to the gas mixture GM that includes the halogen element-containing gas and the catalytic gas including hydrogen atoms, and then, removing at least a portion of the surface region 54A in a wet manner by using the acidic solution AS. According to embodiments of a method of the inventive concept, the hafnium oxide film 54 is removed from the exposed surface 54S of the hafnium oxide film 54 on an atomic layer basis. Therefore, it is determined in process P26 of FIG. 1 whether the hafnium oxide film 54 is removed by the intended thickness, and a cycle of performing a sequence of the dry treatment of process P22 and the wet treatment of process P24 is repeated once or a plurality of times, as needed. The total etch amount of the hafnium oxide film 54 can be adjusted by adjusting the number of cycle repetitions.

Figure 4A:
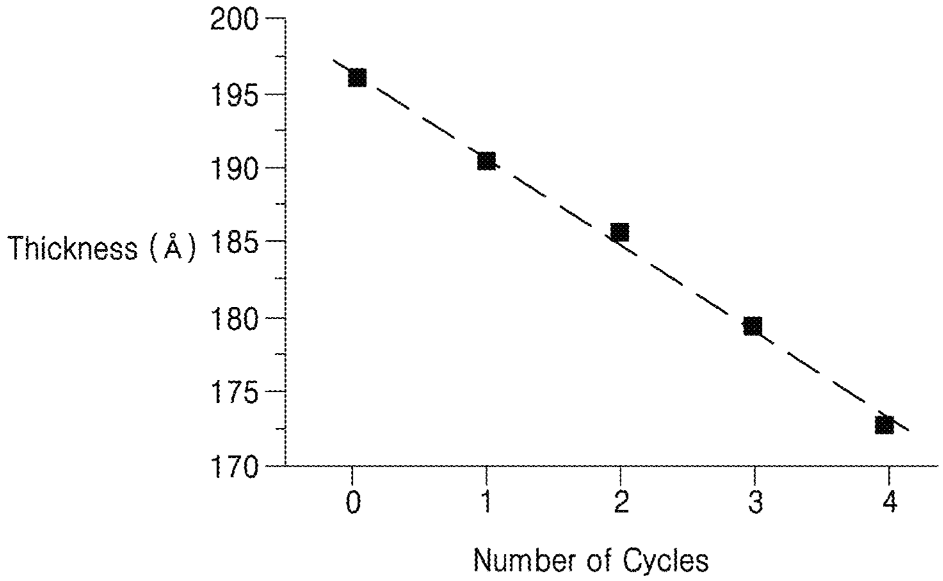
FIG. 4A is a graph of thickness as a function of etching cycles of a hafnium oxide film in a method of manufacturing an integrated circuit device, according to some embodiments.

FIG. 4A is a graph that illustrates an evaluation result obtained by etching portions of a hafnium oxide film according to a method described with reference to FIGS. 1 and 3. The graph of FIG. 4A shows thickness in Angstroms as a function of a number of cycles.

For the evaluation of FIG. 4A, a hafnium oxide film crystallized in process P20 of FIG. 1 was etched.

For example, the crystallized hafnium oxide film underwent the dry treatment of process P22 at a temperature of about 80° C. and a pressure of about 1 Torr. HF gas was used as the halogen element-containing gas and $NH_3$ gas was used as the catalytic gas. The dry treatment of process P22 of FIG. 1 was performed as follows. In process P22A of FIG. 3, an exposed surface of the crystallized hafnium oxide film was pre-treated with $NH_3$ gas for 10 seconds at a temperature of about 80° C. and a pressure of about 1 Torr. In process P22B of FIG. 3, the crystallized hafnium oxide film was exposed to a mixture of HF gas and $NH_3$ gas supplied in a flow-rate ratio of 12:5, for 60 seconds at a temperature of about 80° C. and a pressure of about 1 Torr. In process P22C of FIG. 3, the crystallized hafnium oxide film was heat-treated for about 10 seconds at a temperature of about 150° C. A purge process of process P22D of FIG. 3 was performed for 90 seconds by using nitrogen ($N_2$) gas, and then, a pumping process of process P22E of FIG. 3 was performed for 10 seconds. In process P22F of FIG. 3, the sequence of processes P22A, P22B, P22C, P22D, and P22E was repeated 10 times.

The crystallized hafnium oxide film that has undergone the dry treatment as described above, underwent wet treatment for 60 seconds at a temperature of 25° C. with an acidic solution that includes a mixed solution of DHF and an SPM, in process P24 of FIG. 1.

When the dry treatment of process P22 of FIG. 1 described above and the wet treatment of process P24 of FIG. 1 described above were taken as one cycle, changes in the thickness of the crystallized hafnium oxide film as a function of the number of repeated cycles were measured and are shown in FIG. 4A.

From the results of FIG. 4A, it can be seen that, as the number of repetitions of the cycle of the dry treatment of process P22 of FIG. 1 and the wet treatment of process P24 of FIG. 1 increases, the thickness of the crystallized hafnium oxide film linearly decreases at a rate of about 5.73 Å/cycle.

Figure 4B:
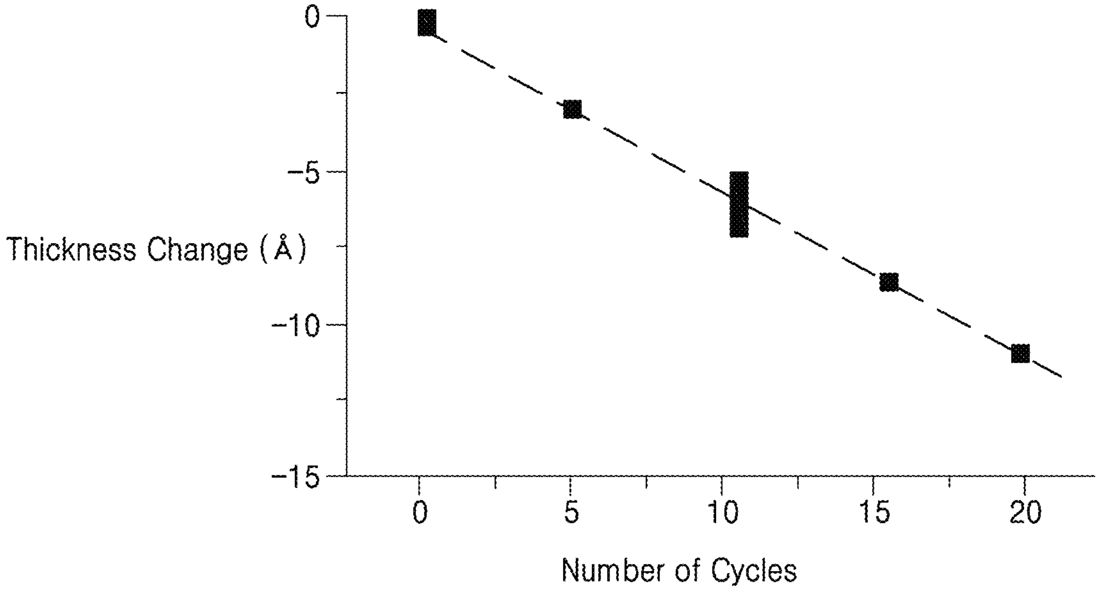
FIG. 4B is a graph of a change in thickness as a function of etching cycles of a hafnium oxide film in a method of manufacturing an integrated circuit device, according to some embodiments.

FIG. 4B is a graph illustrates another evaluation result obtained by etching portions of a hafnium oxide film according to a method described with reference to FIGS. 1 and 3. The graph of FIG. 4B shows a change in thickness in Angstroms as a function of a number of cycles.

For the evaluation of FIG. 4B, an etching process was performed on a crystallized hafnium oxide film under substantially the same conditions as in the processes performed for the evaluation of FIG. 4A. However, in the present evaluation example, changes in the thickness of the crystallized hafnium oxide film were measured as a function of the number of repetitions of a sequence of processes, which include processes P22A, P22B, P22C, P22D, and P22E, and are shown in FIG. 4B, where the number of repetitions was determined in process P22F of FIG. 3.

From the results of FIG. 4B, it can be seen that, as the number of repetitions of the sequence of processes P22A, P22B, P22C, P22D, and P22E increases, the amount of the thickness reduction of the crystallized hafnium oxide film linearly changes within a range of about 0.5 Å to about 11 Å.

In a comparative example, when a metal-containing compound, such as $TiCl_4$ or dimethylaluminum chloride (DMAC), and HF are used together as reactants to etch a hafnium oxide film, a relatively high process temperature of about 150° C. or more is needed to etch the hafnium oxide film. According to embodiments of the inventive concept, when performing a dry treatment process that etches a crystallized hafnium oxide film, because a halogen element-containing gas and a catalytic gas are used together, the dry treatment process can be performed at a relatively low temperature in a range of about 40° C. to about 120° C. Therefore, in a manufacturing process of an integrated circuit device according to an embodiment, which includes a process of etching a hafnium oxide film, the deterioration of unit devices due to thermal exposure can be prevented, a manufacturing process of an integrated circuit device can be facilitated, and the cost of a manufacturing process of an integrated circuit device can be reduced.

FIGS. 5A to 5D are cross-sectional views that illustrating a sequence of processes of a method of manufacturing an integrated circuit device, according to some embodiments. In FIGS. 5A to 5D, the same reference numerals as in FIGS. 2A to 2C denote the same members, and thus repeated descriptions thereof are omitted.

Figure 5A:
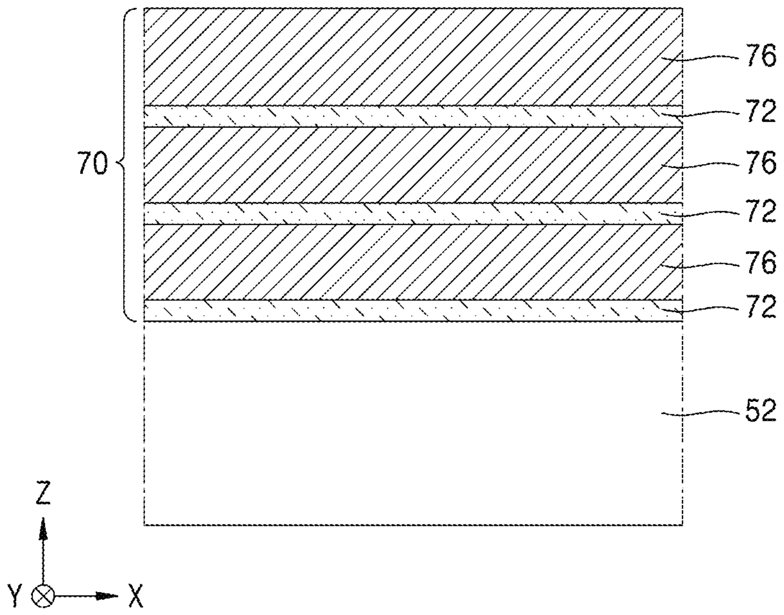
FIGS. 5A to 5D are cross-sectional views that illustrate a sequence of processes of a method of manufacturing an integrated circuit device, according to some embodiments.

Referring to FIG. 5A, in an embodiment, a stack structure 70, in which a plurality of hafnium oxide films 72 and a plurality of intermediate films 76 are alternately arranged in the vertical direction (Z direction), is formed on the substrate 52.

In some embodiments, each of the plurality of hafnium oxide films 72 includes an $HfO_2$ film. In some embodiments, each of the plurality of hafnium oxide films 72 has an orthorhombic crystal phase or a monoclinic crystal phase.

Each of the plurality of intermediate films 76 includes a film that does not include the element hafnium. In some embodiments, each of the plurality of intermediate films 76 includes, but is not limited to, one of a polysilicon film, a silicon oxide film, a silicon nitride film, or a combination thereof. For example, each of the plurality of intermediate films 76 includes a polysilicon film.

Figure 5B:
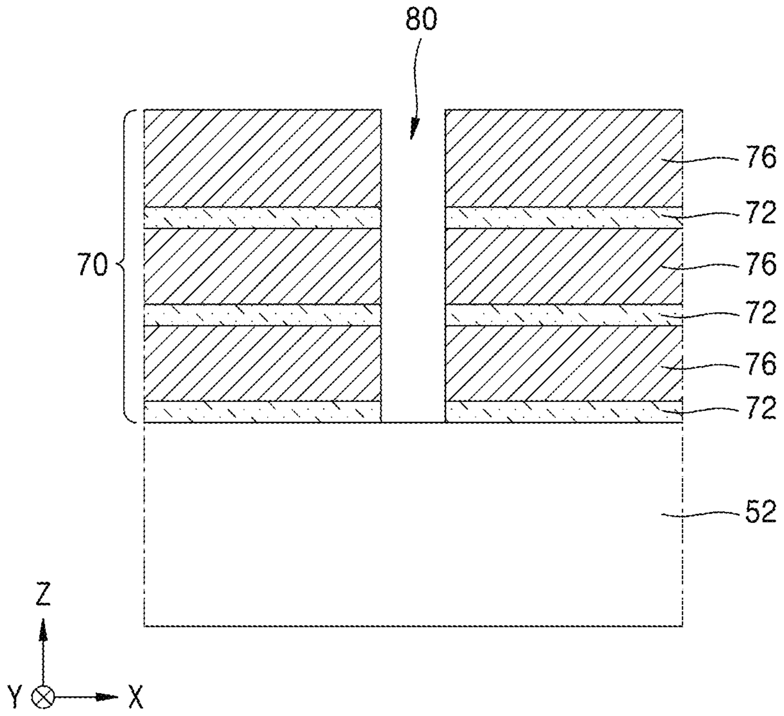

Referring to FIG. 5B, in an embodiment, an opening 80 is formed that passes through the stack structure 70 in the vertical direction (Z direction).

In some embodiments, the opening 80 has a linear shape that passes through the stack structure 70 in the vertical direction (Z direction) and extends lengthwise in the horizontal direction (Y direction in FIG. 5B). In some embodiments, the opening 80 has a vertical hole shape that passes through the stack structure 70 in the vertical direction (Z direction). To form the opening 80, an anisotropic dry etching process is performed. After the opening 80 is formed, the plurality of hafnium oxide films 72 are exposed in the opening 80.

Figure 5C:
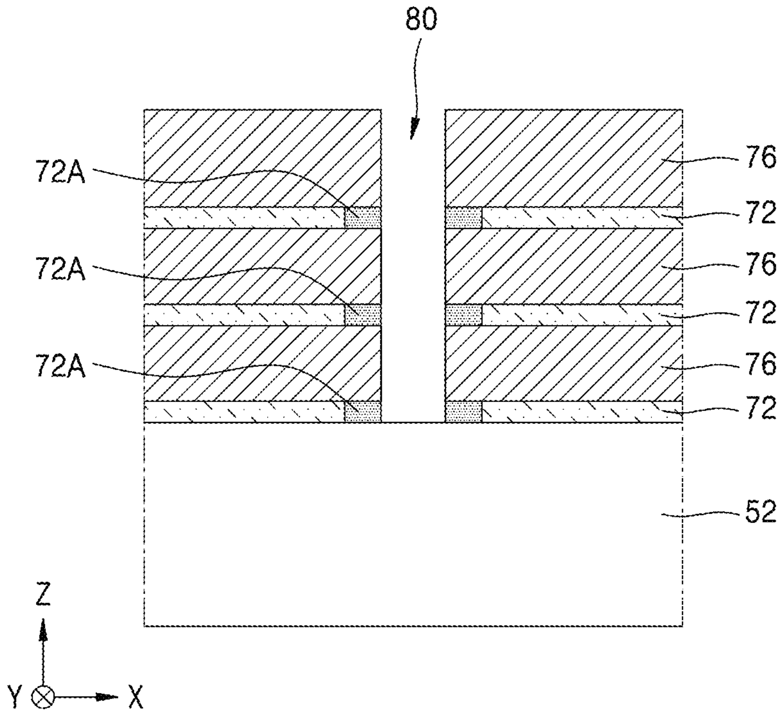
Figure 5D:
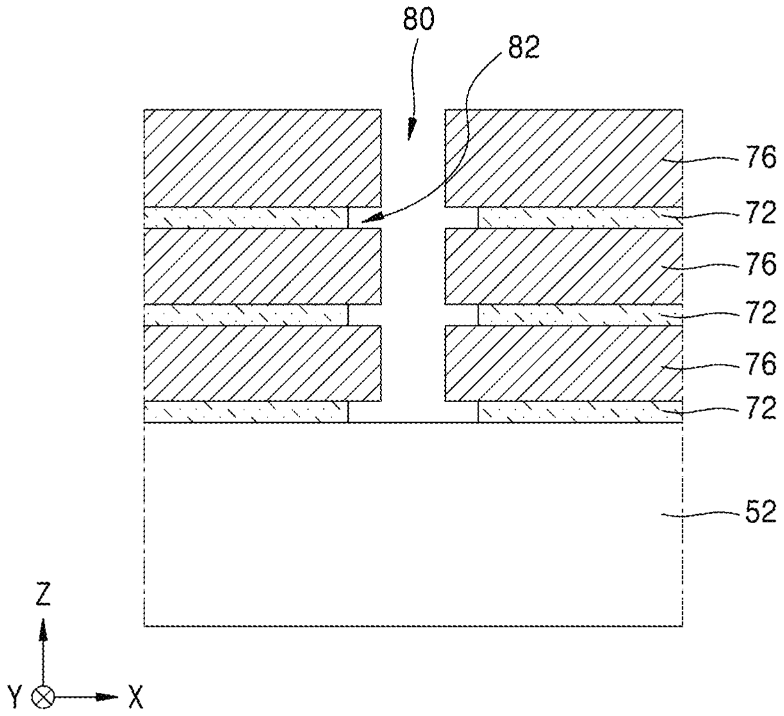

Referring to FIGS. 5C and 5D, in an embodiment, a portion of each of the plurality of hafnium oxide films 72 exposed by the opening 80 is etched.

For example, as shown in FIG. 5C, the plurality of hafnium oxide films 72 exposed by the opening 80 are isotropically exposed to a gas mixture that includes a halogen element-containing gas and a catalytic gas that includes hydrogen atoms, in an atmosphere in which no plasma is applied onto the substrate 52, thereby performing a dry treatment to change components of a surface region 72A that extends from an exposed surface of each of the plurality of hafnium oxide films 72 into each of the plurality of hafnium oxide films 72 by as much as a predetermined thickness. The dry treatment that changes the components of the surface region 72A of each of the plurality of hafnium oxide films 72 is substantially the same as the dry treatment that changes the components of the surface region 54A of the hafnium oxide film 54 described with reference to FIGS. 1, 2B, and 3.

As shown in FIG. 5D, a wet treatment is performed with an acidic solution that removes at least a portion of the component-changed surface region 72A from each of the plurality of hafnium oxide films 72. The wet treatment that removes at least a portion of the surface region 72A from each of the plurality of hafnium oxide films 72 is substantially the same as the wet treatment that removes at least a portion of the surface region 54A of the hafnium oxide film 54 described with reference to FIGS. 1 and 2C.

As shown in FIG. 5D, a sequence of the dry treatment and the wet treatment can be repeated once or a plurality of times, thereby forming an indent space 82 that extends in the horizontal direction (X direction in FIG. 5D) between the plurality of intermediate films 76 and is connected with the opening 80.

Figure 6:
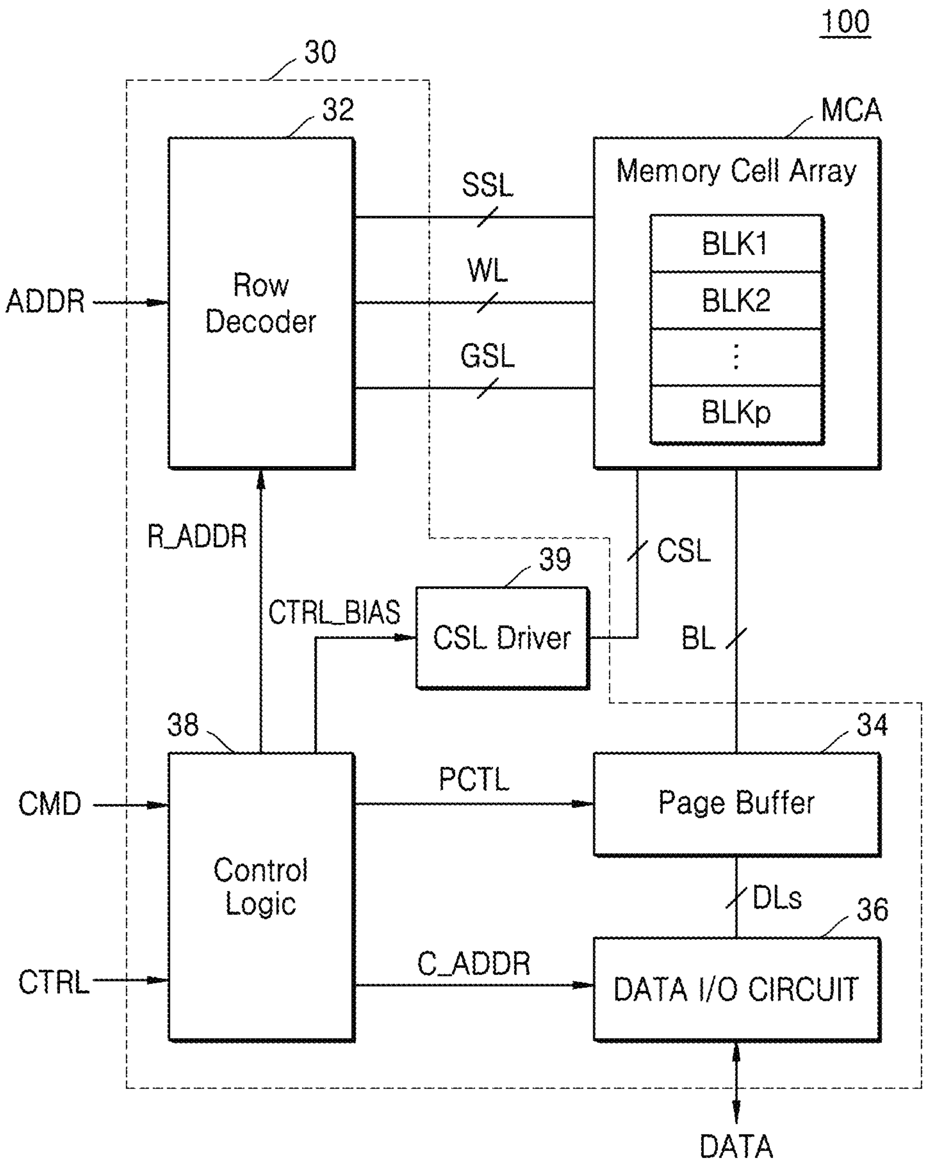
FIG. 6 is a block diagram of an integrated circuit device manufactured by a manufacturing method according to some embodiments.

FIG. 6 is a block diagram of an integrated circuit device 100 that can be manufactured by a manufacturing method according to some embodiments.

Referring to FIG. 6, in an embodiment, the integrated circuit device 100 includes a memory cell array MCA and a peripheral circuit 30. The memory cell array MCA includes a plurality of memory cell blocks BLK1, BLK2, . . . , and BLKp, and each of the plurality of memory cell blocks BLK1, BLK2, . . . , and BLKp includes a plurality of memory cells. A memory cell block BLK1, BLK2, . . . , or BLKp is connected to the peripheral circuit 30 via a bit line BL, a word line WL, a string select line SSL, and a ground select line GSL.

The peripheral circuit 30 includes a row decoder 32, a page buffer 34, a data input/output circuit 36, a control logic 38, and a common source line (CSL) driver 39. The peripheral circuit 30 further includes various circuits, such as a voltage generation circuit for generating various voltages that operate the integrated circuit device 100, an error correction circuit that corrects errors in data read from the memory cell array MCA, an input/output interface, etc.

The memory cell array MCA is connected to the row decoder 32 via the word line WL, the string select line SSL, and the ground select line GSL and is connected to the page buffer 34 via the bit line BL. In the memory cell array MCA, each of the plurality of memory cells in the plurality of memory cell blocks BLK1, BLK2, . . . , and BLKp, includes a flash memory cell. The memory cell array MCA includes a 3-dimensional memory cell array. The 3-dimensional memory cell array includes a plurality of NAND strings, and each of the plurality of NAND strings includes a plurality of memory cells respectively connected to a plurality of word lines WL that are vertically stacked.

The peripheral circuit 30 receives an address ADDR, a command CMD, and a control signal CTRL from an external device and transmits data DATA to and receives data DATA from the external device.

The row decoder 32 selects at least one of the plurality of memory cell blocks BLK1, BLK2, . . . , and BLKp in response to the received address ADDR and selects the word line WL, the string select line SSL, and the ground select line GSL of the selected memory cell block. The row decoder 32 transmits to the word line WL of the selected memory cell block a voltage that performs a memory operation.

The page buffer 34 is connected to the memory cell array MCA via the bit line BL. The page buffer 34 transmits a voltage based on the data DATA, which is to be stored in the memory cell array MCA, to the bit line BL by operating as a write driver during a program operation, and senses the data DATA stored in the memory cell array MCA by operating as a sense amplifier during a read operation. The page buffer 34 operates according to a control signal PCTL received from the control logic 38.

The data input/output circuit 36 is connected with the page buffer 34 via a plurality of data lines DLs. During a program operation, the data input/output circuit 36 receives the data DATA from a memory controller and provides program data DATA to the page buffer 34, based on a column address C_ADDR received from the control logic 38. During the read operation, the data input/output circuit 36 provides read data DATA stored in the page buffer 34 to the memory controller, based on the column address C_ADDR received from the control logic 38.

The data input/output circuit 36 transmits an address or a command, which is input thereto, to the control logic 38 or the row decoder 32. The peripheral circuit 30 further includes an electrostatic discharge (ESD) circuit and a pull-up/pull-down driver.

The control logic 38 receives the command CMD and the control signal CTRL from a memory controller. The control logic 38 provides a row address R_ADDR to the row decoder 32 and the column address C_ADDR to the data input/output circuit 36. The control logic 38 generates various internal control signals that are used in the integrated circuit device 100 in response to the control signal CTRL. For example, when a memory operation, such as a program operation or an erase operation, is performed, the control logic 38 adjusts levels of voltages respectively provided to the word line WL and the bit line BL.

The common source line driver 39 is connected to the memory cell array MCA via a common source line CSL. The common source line driver 39 transmits a common source voltage, such as a power supply voltage, or a ground voltage to the common source line CSL, based on a control signal CTRL_BIAS received from the control logic 38.

Figure 7A:
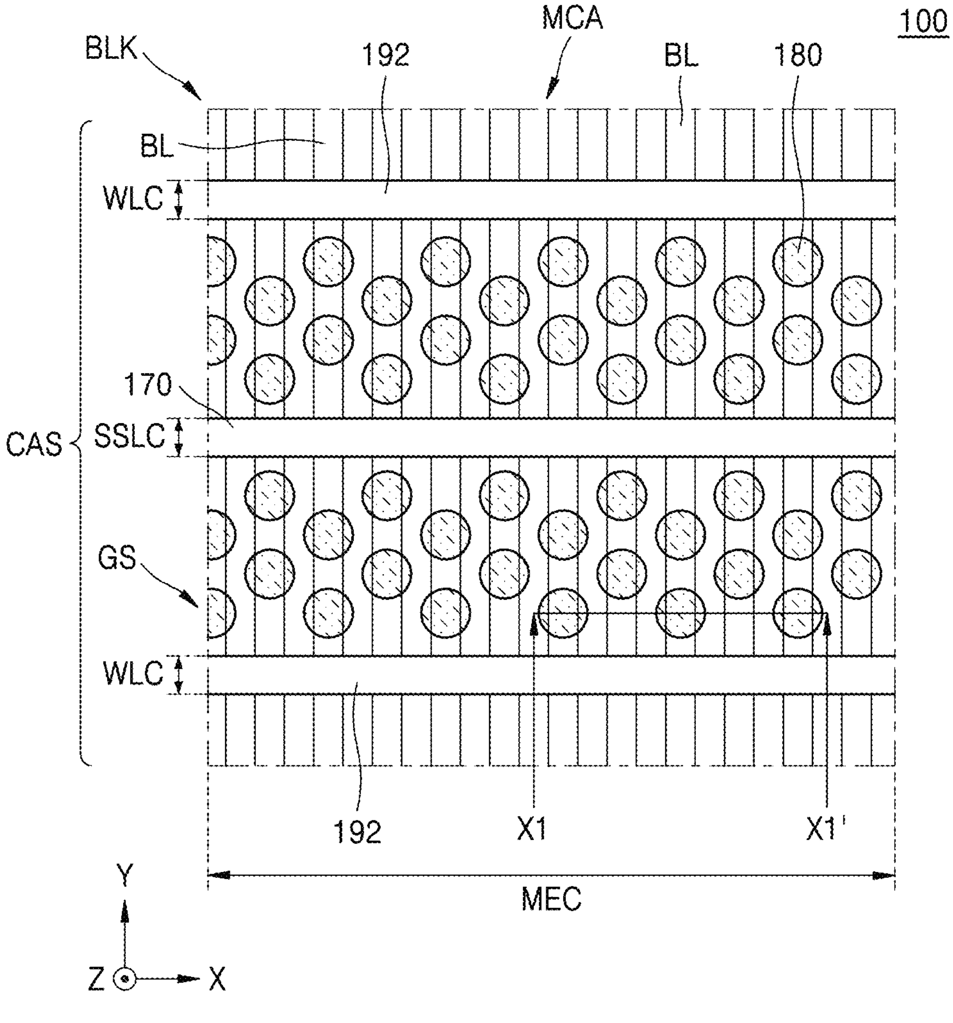
FIG. 7A is a planar layout of some components of a cell array structure of an integrated circuit device shown in FIG. 6.
Figure 7B:
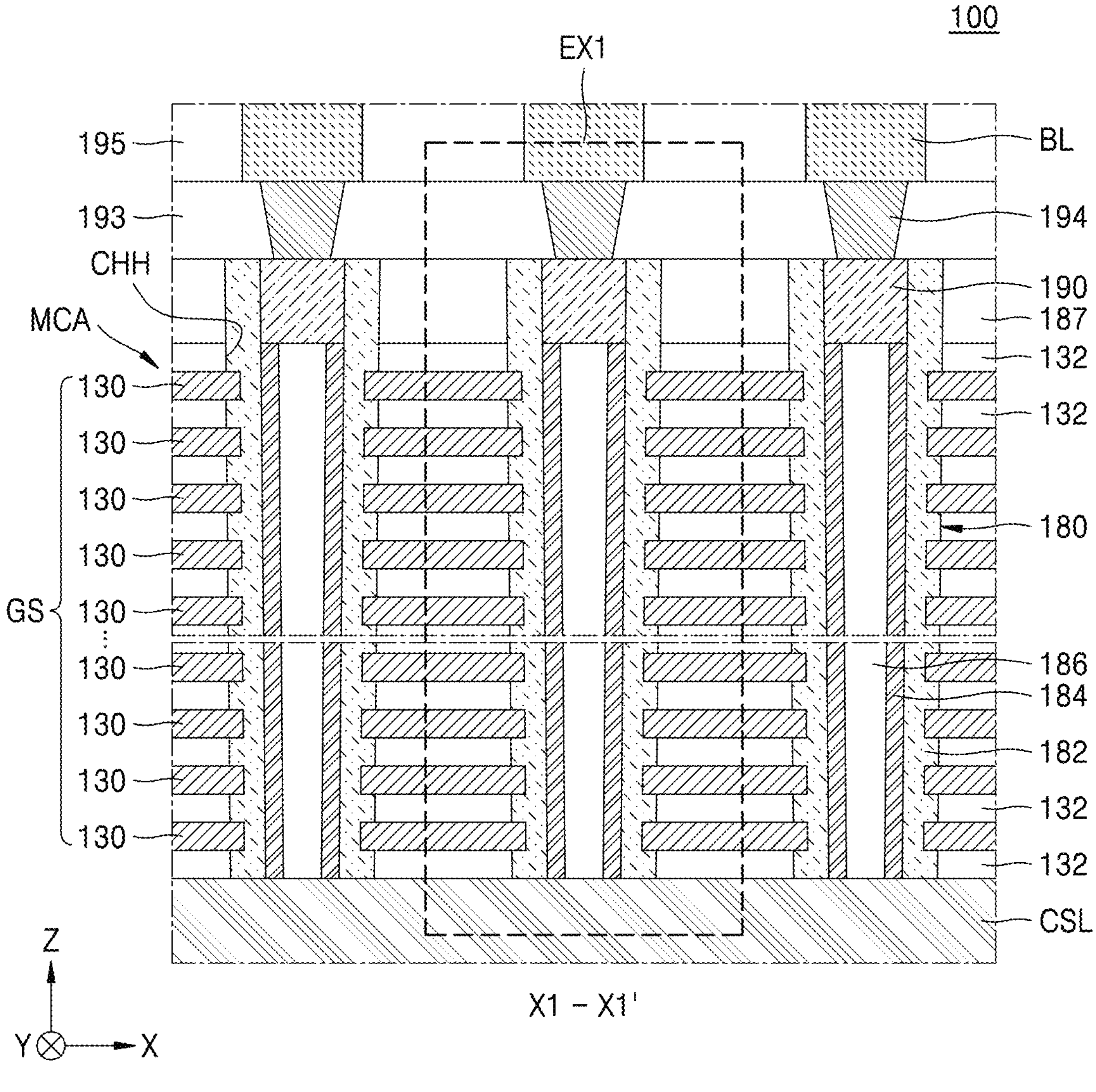
FIG. 7B is a cross-sectional view of some regions of a cell array structure of FIG. 7, taken along a line X1-X1' of FIG. 7A.
Figure 7C:
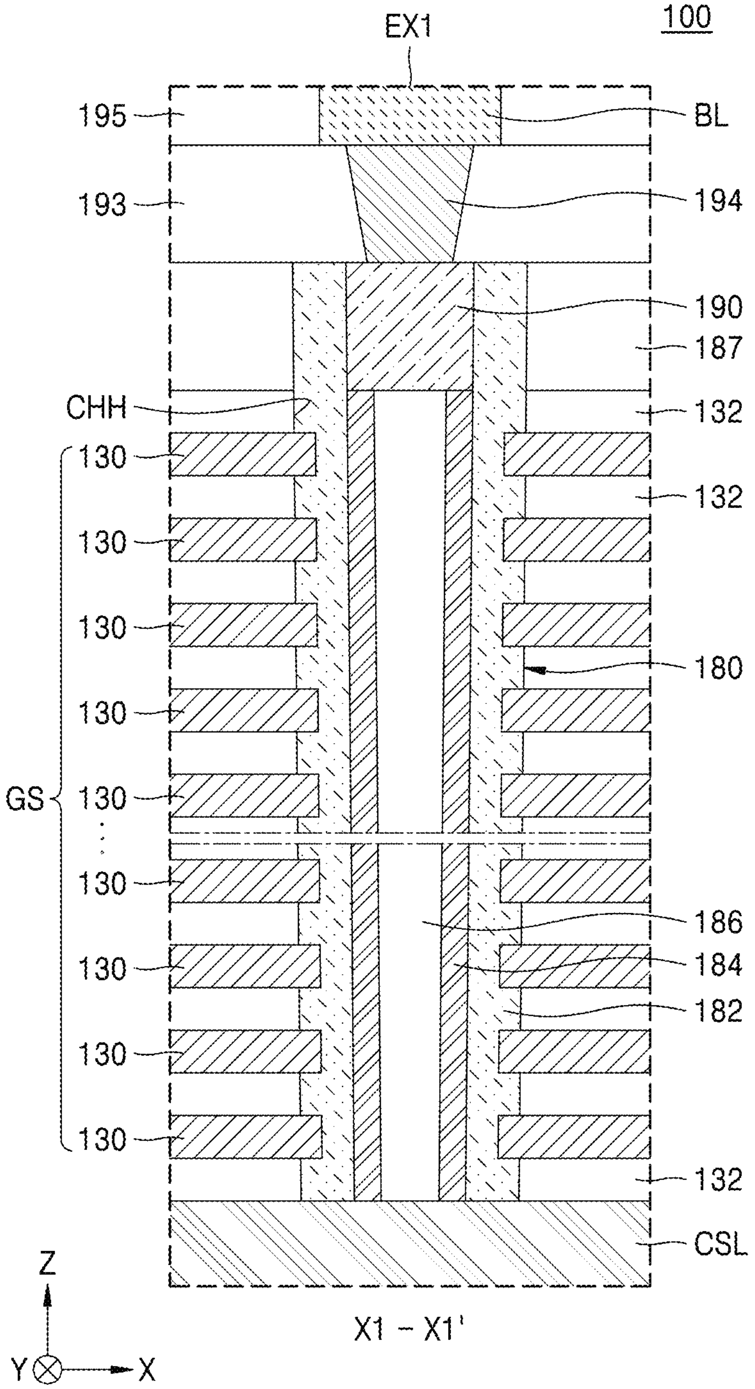
FIG. 7C is an enlarged cross-sectional view of a region EX1 of FIG. 7B, FIGS. 8A to 8K are cross-sectional views that illustrate a method of manufacturing an integrated circuit device, according to some embodiments.

FIG. 7A is a planar layout that illustrates some components of a cell array structure CAS of the integrated circuit device 100 shown in FIG. 6. FIG. 7B is a cross-sectional view of portions of the cell array structure CAS of the integrated circuit device 100, taken along a line X1-X1' of FIG. 7A. FIG. 7C is an enlarged cross-sectional view of a region EX1 of FIG. 7B. FIGS. 7A and 7B each illustrate some components of a memory cell block BLK that corresponds to one of the plurality of memory cell blocks BLK1, BLK2, . . . , and BLKp shown in FIG. 6.

Referring to FIGS. 7A to 7C, in some embodiments, the integrated circuit device 100 includes the cell array structure CAS, and the cell array structure CAS includes a memory cell area MEC in which the memory cell array MCA is arranged.

The cell array structure CAS includes the common source line CSL, and the memory cell array MCA arranged over the common source line CSL. The memory cell array MCA includes a gate stack GS that includes a plurality of gate lines 130. The plurality of gate lines 130 of the gate stack GS extend in the horizontal direction parallel to the common source line CSL, and overlap each other in the vertical direction (Z direction). The plurality of gate lines 130 include the plurality of word lines WL, the ground select line GSL, and the string select line SSL, which are shown in FIG. 6.

As shown in FIG. 7B, in an embodiment, the cell array structure CAS includes a stack structure that includes the gate stack GS and a plurality of insulating films 132 that are alternately arranged with the plurality of gate lines 130. The gate stack GS includes the plurality of gate lines 130 that overlap each other in the vertical direction (Z direction) over the common source line CSL and are spaced apart from each other in the vertical direction (Z direction). The plurality of insulating films 132 are disposed above the common source line CSL and between the plurality of gate lines 130. The stack structure further includes an intermediate insulating film 187 that covers the uppermost insulating film 132. A gate line 130 closest to a conductive pad 190 is covered by the insulating film 132 and the intermediate insulating film 187. The plurality of insulating films 132 and the intermediate insulating film 187 each include one of silicon oxide, silicon nitride, or SiON.

A plurality of conductive pads 190 are spaced apart from the common source line CSL in the vertical direction (Z direction) with the stack structure therebetween. Herein, the common source line CSL may be referred to as a conductive layer.

Each of the plurality of gate lines 130 includes at least one of a metal, a conductive metal nitride, a metal silicide, an impurity-doped semiconductor, or a combination thereof. For example, each of the plurality of gate lines 130 includes, but is not limited to, one of tungsten, nickel, cobalt, tantalum, tungsten nitride, titanium nitride, tantalum nitride, doped polysilicon, tungsten silicide, nickel silicide, cobalt silicide, tantalum silicide, or a combination thereof.

The plurality of conductive pads 190 and the common source line CSL each include one of a semiconductor material, a metal, a conductive metal nitride, or a combination thereof. For example, the plurality of conductive pads 190 and the common source line CSL each include, but are not limited to, one of doped polysilicon, tungsten, titanium, tantalum, copper, aluminum, titanium nitride, tantalum nitride, tungsten nitride, or a combination thereof.

The cell array structure CAS includes a plurality of vertical holes CHH that pass through the stack structure in the vertical direction (Z direction), and a plurality of channel structures 180 that are respectively arranged in the plurality of vertical holes CHH and pass through the plurality of gate lines 130 and the plurality of insulating films 132 of the stack structure in the vertical direction (Z direction). Each of the plurality of channel structures 180 includes a hafnium oxide film 182, a channel layer 184, and an insulating plug 186 that are sequentially stacked in the stated order in a direction from the plurality of gate lines 130 toward the center of the channel structure 180.

The channel layer 184 extends lengthwise in the vertical direction (Z direction) in the channel hole CHH. An end portion of the channel layer 184 is in direct contact with a conductive pad 190, and the other end portion of the channel layer 184 is in direct contact with the common source line CSL. The insulating plug 186 is surrounded by the channel layer 184.

The hafnium oxide film 182 extends lengthwise in the vertical direction (Z direction) in the channel hole CHH such that the hafnium oxide film 182 is arranged between the channel layer 184 and the plurality of gate lines 130 of the stack structure and between the channel layer 184 and the plurality of insulating films 132 of the stack structure. An end portion of the hafnium oxide film 182 is in direct contact with the conductive pad 190, and the other end portion of the hafnium oxide film 182 is in direct contact with the common source line CSL. The thickness of the hafnium oxide film 182 in the horizontal direction (such as the X direction in FIGS. 7B and 7C), varies along the vertical direction (Z direction).

In some embodiments, the hafnium oxide film 182 includes a $HfO_2$ film. In some embodiments, the hafnium oxide film 182 includes a hafnium oxide film that has an orthorhombic crystal phase or a monoclinic crystal phase.

The channel layer 184 includes one of polysilicon, an oxide semiconductor, a 2-dimensional semiconductor material, or a combination thereof. The polysilicon includes, but is not limited to, doped polysilicon. The oxide semiconductor is one of InGaZnO(IGZO), Sn-IGZO, InWO(IWO), InZnO(IZO), ZnSnO(ZTO), ZnO, yttrium-doped zinc oxide (YZO), InGaSiO(IGSO), InO, SnO, TiO, ZnON, MgZnO, ZrInZnO, HfInZnO, SnInZnO, SiInZnO, GaZnSnO, ZrZnSnO, or a combination thereof. In some embodiments, at least a portion of the channel layer 184 includes the same elements as the oxide semiconductor and further includes at least one dopant selected from aluminum (Al), boron (B), arsenic (As), fluorine (F), or hydrogen (H), in addition to the elements set forth above.

In some embodiments, the 2-dimensional semiconductor material is one of graphene, black phosphorous, a transition metal chalcogenide, or a combination thereof. The transition metal chalcogenide includes a combination of a transition metal selected from Ni, Cu, Zn, Mo, W, Nb, V, Ta, Ti, Zr, Hf, Tc, or Re, and a chalcogen-group element selected from S, Se, or Te. For example, the channel layer 184 includes, but is not limited to, at least one of $MoS_2$, $MoSe_2$, $MoTe_2$, $WS_2$, $WSe_2$, $WTe_2$, $ZrS_2$, $ZrSc_2$, $HfS_2$, $HfSe_2$, $NbSe_2$, $ReSe_2$, CuS, or a combination thereof.

In some embodiments, the 2-dimensional semiconductor material includes a chalcogenide material that includes a non-transition metal. The non-transition metal is one of Ga, In, Sn, Ge, or Pb. For example, the channel layer 184 includes, but is not limited to, at least one of $SnSe_2$, GaS, GaSe, GaTe, GeSe, $In_2Se_3$, $InSnS_2$, or a combination thereof.

In some embodiments, the channel layer 184 includes one of a p-type oxide semiconductor, an n-type oxide semiconductor, or a combination thereof. The p-type oxide semiconductor is one of nickel oxide (NiO), copper oxide, tin oxide (SnO), copper aluminum oxide ($CuAlO_2$), copper chromium oxide ($CuCrO_2$), beta tellurium dioxide ($\beta$-$TeO_2$), or a combination thereof. The copper oxide includes, but is not limited to, CuO or $Cu_2O$. The n-type oxide semiconductor is one of indium oxide ($In_2O_3$), tin oxide ($SnO_2$), zinc oxide (ZnO), IGZO, or a combination thereof. The tin oxide exhibits p-type characteristics in the form of SnO and exhibits n-type characteristics in the form of $SnO_2$.

In some embodiments, to adjust the carrier mobility in the channel layer 184, the channel layer 184 further includes a p-type dopant or an n-type dopant. The channel layer 184 has, but is not limited to, a thickness of about 3 nm to about 20 nm, such as about 5 nm to about 18 nm, in the horizontal direction (for example, the X direction).

The channel layer 184 has a cylindrical shape that defines a columnar space therein, where the columnar space extends lengthwise in the vertical direction (Z direction). The channel layer 184 is in direct contact with one of the conductive pads 190.

The insulating plug 186 is disposed in the columnar space surrounded by the channel layer 184. The insulating plug 186 fills a space between the conductive pad 190 and the common source line CSL in the columnar space surrounded by the channel layer 184. The insulating plug 186 has a surface in direct contact with the channel layer 184. The insulating plug 186 may include, but is not limited to, a silicon oxide film.

In the cell array structure CAS, a plurality of bit lines BL are disposed over the plurality of channel structures 180. A plurality of bit line contact pads 194 are interposed between the plurality of channel structures 180 and the plurality of bit lines BL. The conductive pad 190 disposed on one end of each of the plurality of channel structures 180 is connected to a corresponding bit line BL via a bit line contact pad 194. The plurality of bit line contact pads 194 are insulated from each other by a first upper insulating film 193.

A portion of the hafnium oxide film 182 is disposed between the conductive pad 190 and the first upper insulating film 193. The plurality of bit lines BL are insulated from each other by a second upper insulating film 195. The plurality of bit line contact pads 194 and the plurality of bit lines BL each include one of a metal, a conductive metal nitride, or a combination thereof. For example, the plurality of bit line contact pads 194 and the plurality of bit lines BL each include one of tungsten, titanium, tantalum, copper, aluminum, titanium nitride, tantalum nitride, tungsten nitride, or a combination thereof. Each of the first upper insulating film 193 and the second upper insulating film 195 includes one of a silicon oxide film, a silicon nitride film, or a combination thereof.

As shown in FIG. 7A, in an embodiment, in the cell array structure CAS, a plurality of word line cut regions WLC extend in a first horizontal direction (X direction). The plurality of word line cut regions WLC limit the width of the gate stack GS in a second horizontal direction (Y direction). The plurality of word line cut regions WLC are each filled with a word line cut structure 192. The word line cut structure 192 includes one of an insulating film, polysilicon, a metal film, or a combination thereof. In some embodiments, the word line cut structure 192 includes, but is not limited to, one of a silicon oxide film, a silicon nitride film, a polysilicon film, a tungsten film, or a combination thereof.

In the memory cell array MCA, two string select lines SSL (see FIG. 6) adjacent to each other in the second horizontal direction (Y direction) are spaced apart from each other with a string select line cut region SSLC therebetween. The string select line cut region SSLC is filled with an insulating film 170. The insulating film 170 includes one of an oxide film, a nitride film, or a combination thereof. In some embodiments, at least a portion of the string select line cut region SSLC is filled with an air gap. As used herein, the term "air" may refer to the atmosphere, or other gases that may be present during a manufacturing process.

Methods of manufacturing integrated circuit devices, according to some embodiments, will now be described.

FIGS. 8A to 8K are cross-sectional views that illustrate a method of manufacturing an integrated circuit device, according to some embodiments. FIGS. 8A to 8K each illustrate an enlarged cross-sectional configuration of a region that corresponds to the region EX1 of FIG. 7B in a sequence of processes. An example of a method of manufacturing the integrated circuit device 100 shown in FIGS. 7A to 7C is described with reference to FIGS. 8A to 8K. In FIGS. 8A to 8K, the same reference numerals as in FIGS. 7A to 7C may respectively denote the same members, and repeated descriptions thereof may be omitted.

Figure 8A:
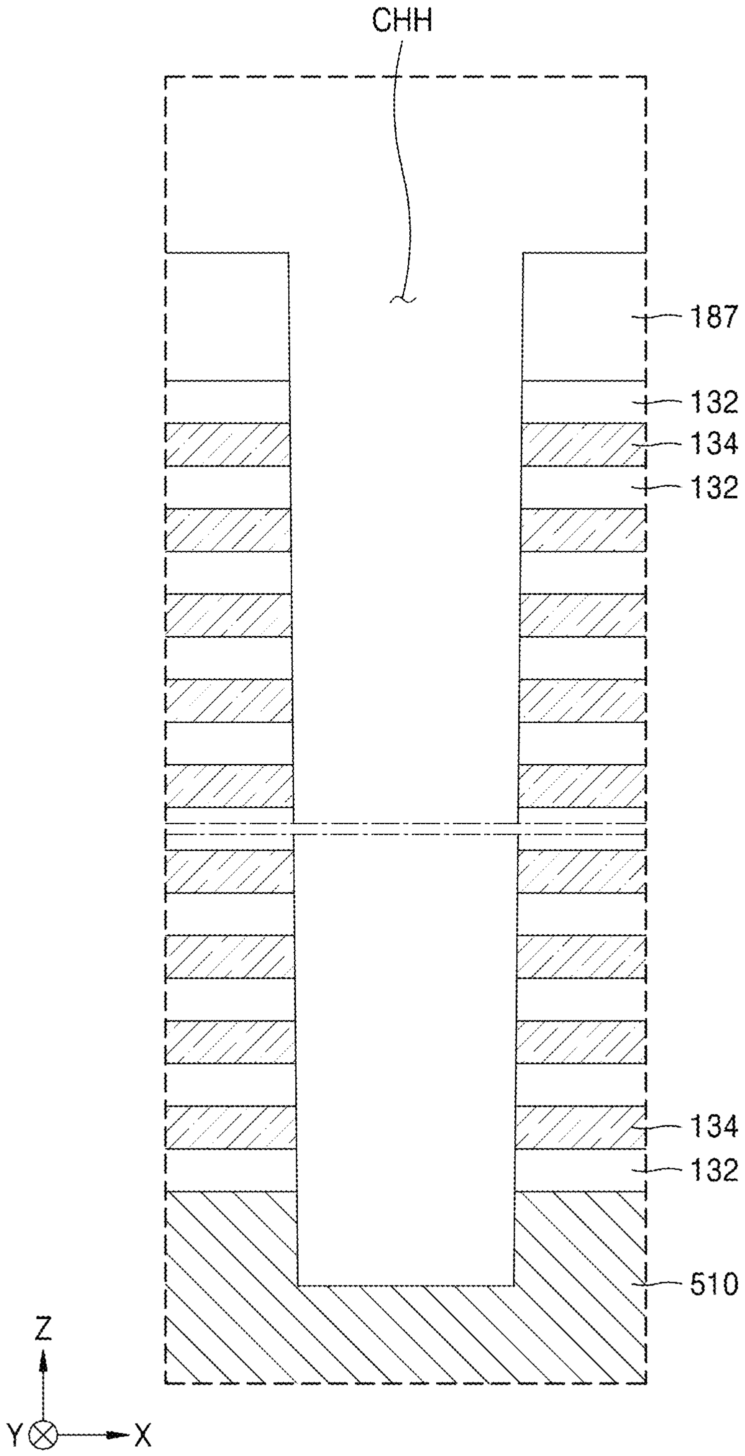

Referring to FIG. 8A, in an embodiment, a plurality of insulating films 132 and a plurality of sacrificial insulating films 134 are alternately stacked on a substrate 510, and the intermediate insulating film 187 is formed on the uppermost insulating film 132. The vertical hole CHH that extends in the vertical direction (Z direction) is formed through the plurality of insulating films 132, the plurality of sacrificial insulating films 134, and the intermediate insulating film 187. The vertical hole CHH is formed to partially penetrate into the substrate 510.

The substrate 510 includes silicon. The plurality of insulating films 132 each include a silicon oxide film, and the plurality of sacrificial insulating films 134 each include a silicon nitride film. Each of the plurality of sacrificial insulating films 134 secures a space for forming the gate stack GS (see FIGS. 7B and 7C) in a subsequent process.

Figure 8B:
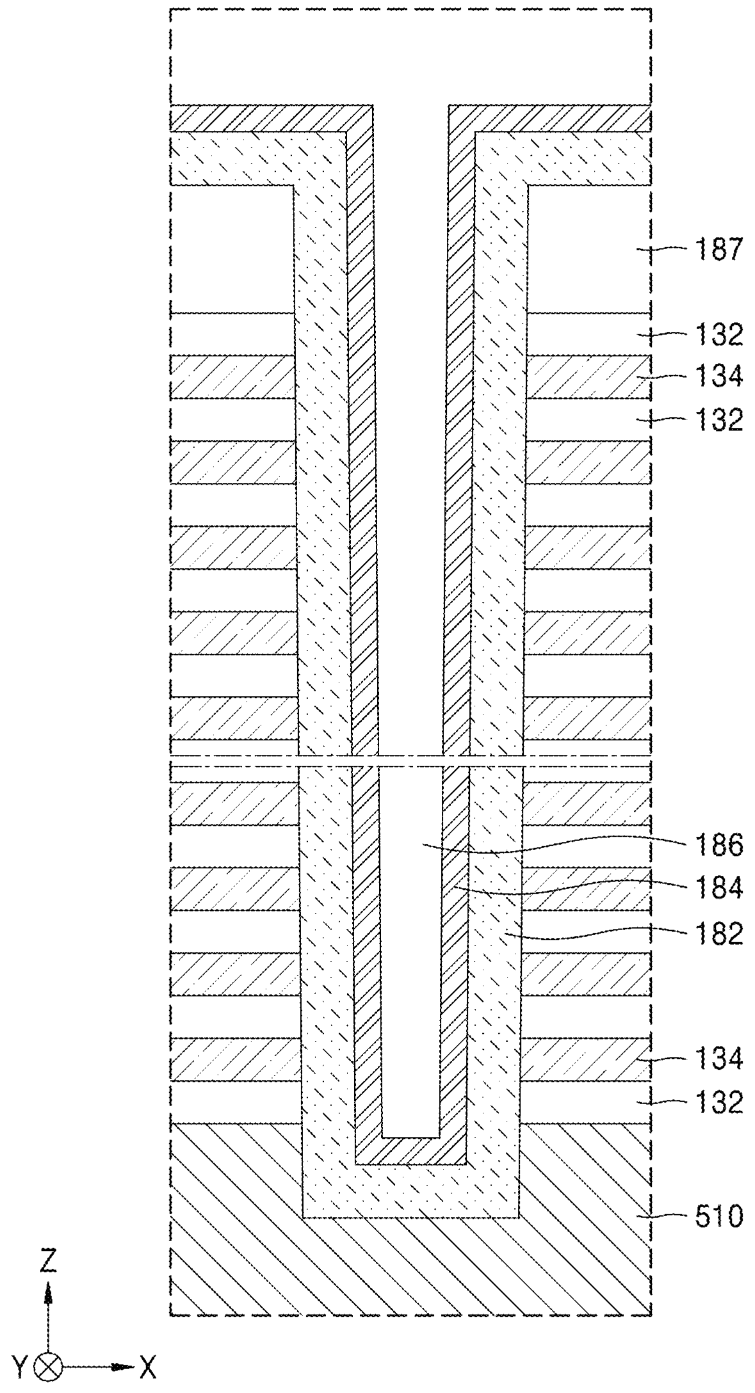

Referring to FIG. 8B, in an embodiment, in the resulting product of FIG. 8A, the hafnium oxide film 182, the channel layer 184, and the insulating plug 186 are sequentially formed in the stated order on exposed surfaces inside and outside the vertical hole CHH. To form each of the hafnium oxide film 182 and the channel layer 184, an atomic layer deposition (ALD) process is used. To form the insulating plug 186, an ALD process or a chemical vapor deposition (CVD) process is used.

Figure 8C:
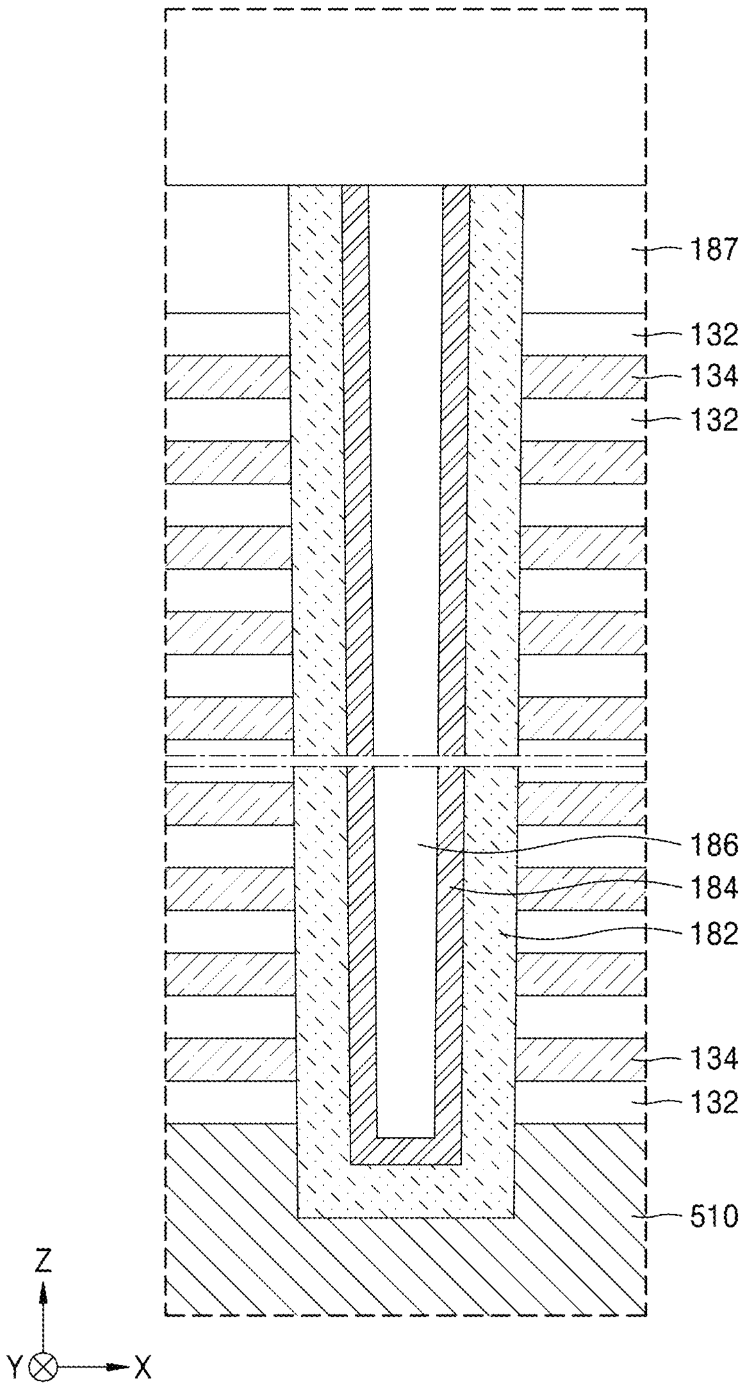

Referring to FIG. 8C, in an embodiment, the upper surface of the intermediate insulating film 187 is exposed by planarizing the resulting product of FIG. 8B. To perform the planarization, a chemical mechanical polishing (CMP) process is used.

Figure 8D:
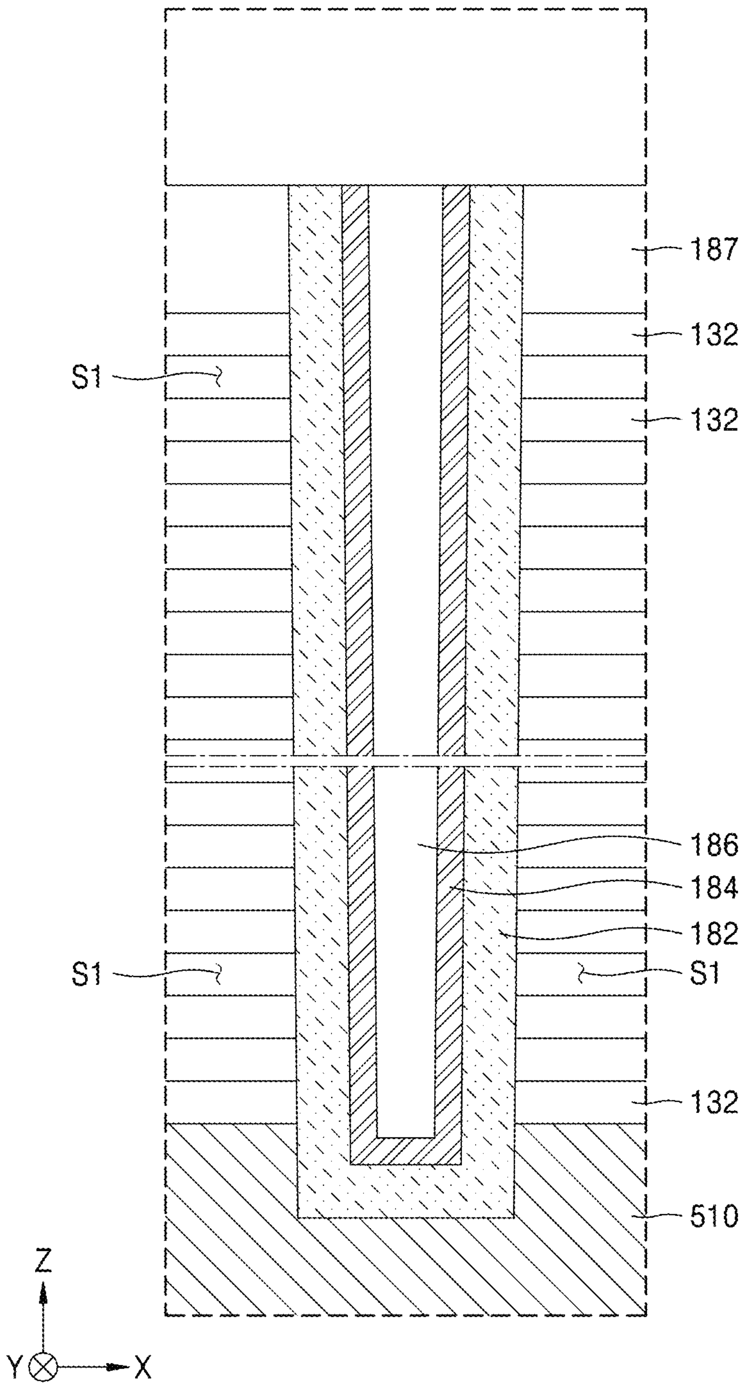

Referring to FIG. 8D, in an embodiment, the plurality of sacrificial insulating films 134 are removed from the resulting product of FIG. 8C, thereby forming a plurality of gate spaces S1. To form the plurality of gate spaces S1, the plurality of word line cut regions WLC described with reference to FIG. 7A are formed in advance, and the plurality of sacrificial insulating films 134 are removed through the plurality of word line cut regions WLC. As a result, the hafnium oxide film 182 are exposed by the plurality of gate spaces S1.

Figure 8E:
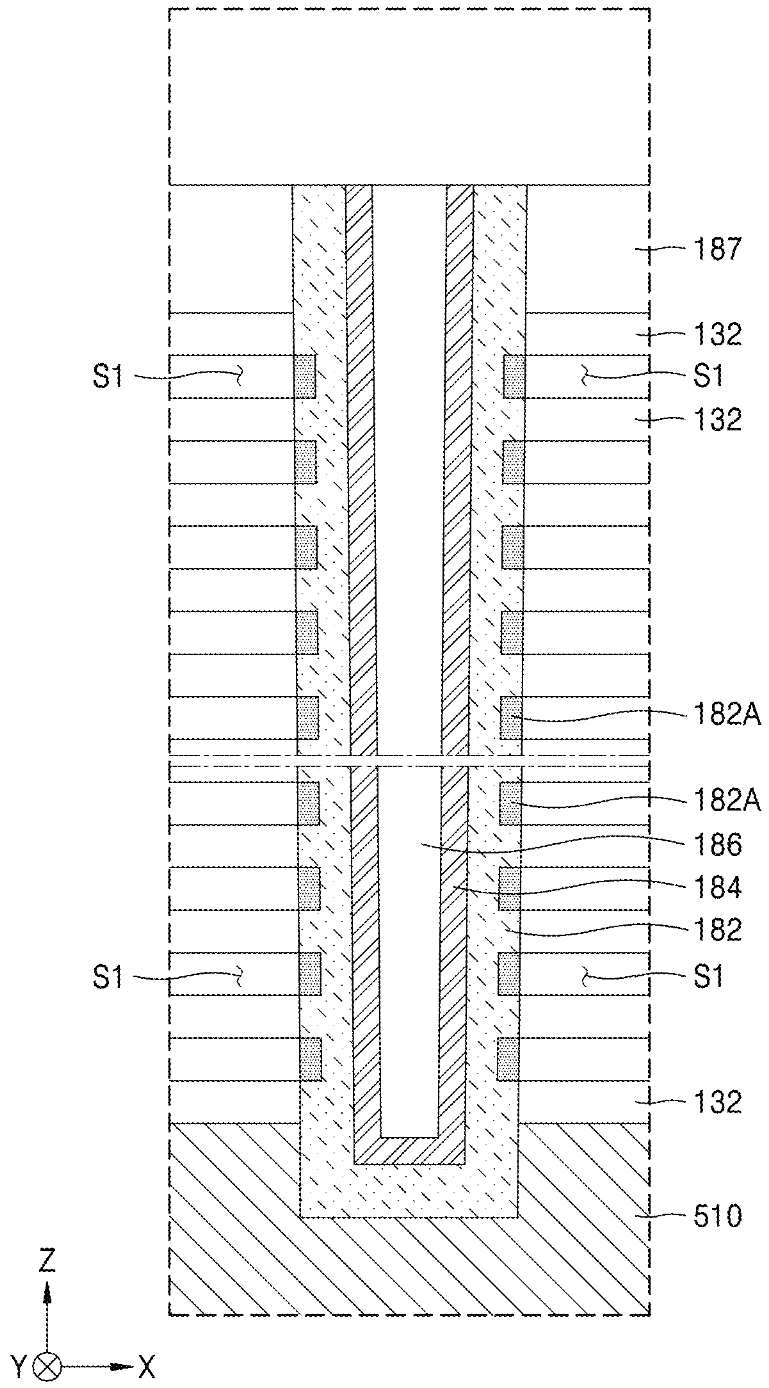
Figure 8F:
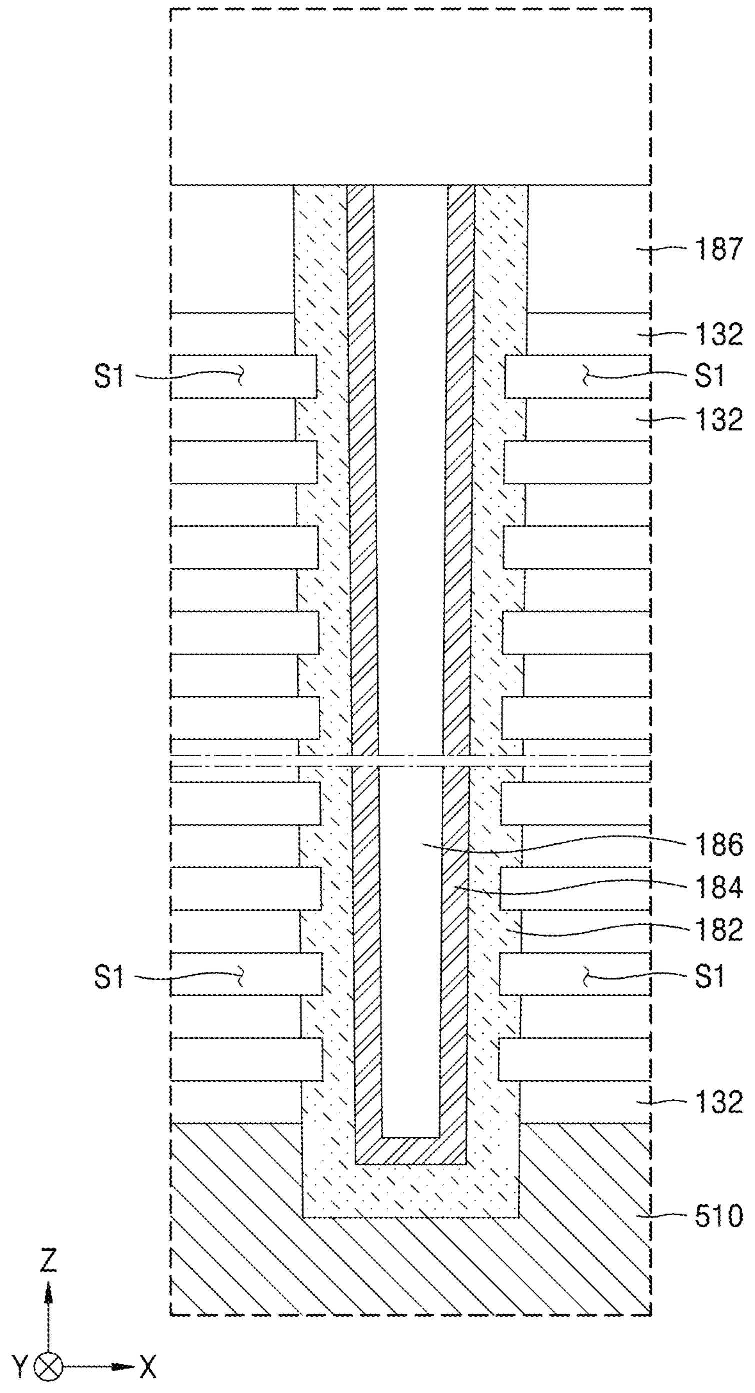

Referring to FIGS. 8E and 8F, in an embodiment, portions of the hafnium oxide film 182 that are respectively exposed by the plurality of gate spaces S1 are removed.

For example, as shown in FIG. 8E, in the resulting product of FIG. 8D, the hafnium oxide film 182 exposed by the plurality of gate spaces S1 is isotropically exposed to a gas mixture that includes a halogen element-containing gas and a catalytic gas that includes hydrogen atoms, in an atmosphere in which no plasma is applied onto the substrate 510, thereby performing a dry treatment that changes components of a surface region 182A that extends downward from the exposed surface of the hafnium oxide film 182 into the hafnium oxide film 182 by as much as a predetermined thickness. The dry treatment that changes the components of the surface region 182A of the hafnium oxide film 182 is substantially the same as the dry treatment that changes the components of the surface region 54A of the hafnium oxide film 54 described with reference to FIGS. 1, 2B, and 3.

A wet treatment is performed on the resulting product of FIG. 8E that removes at least a portion of the component-changed surface region 182A from the hafnium oxide film 182. The wet treatment that removes at least a portion of the surface region 182A of the hafnium oxide film 182 is substantially the same as the wet treatment that removes at least a portion of the surface region 54A of the hafnium oxide film 54 described with reference to FIGS. 1 and 2C.

Portions of the hafnium oxide film 182 are etched through the plurality of gate spaces S1 as shown in FIG. 8F by repeating a sequence of the dry treatment and the wet treatment once or a plurality of times, thereby expanding the plurality of gate spaces S1 in the horizontal direction, such as a radial direction with the vertical hole CHH as the center and along the X-Y plane, in FIG. 8F.

Figure 8G:
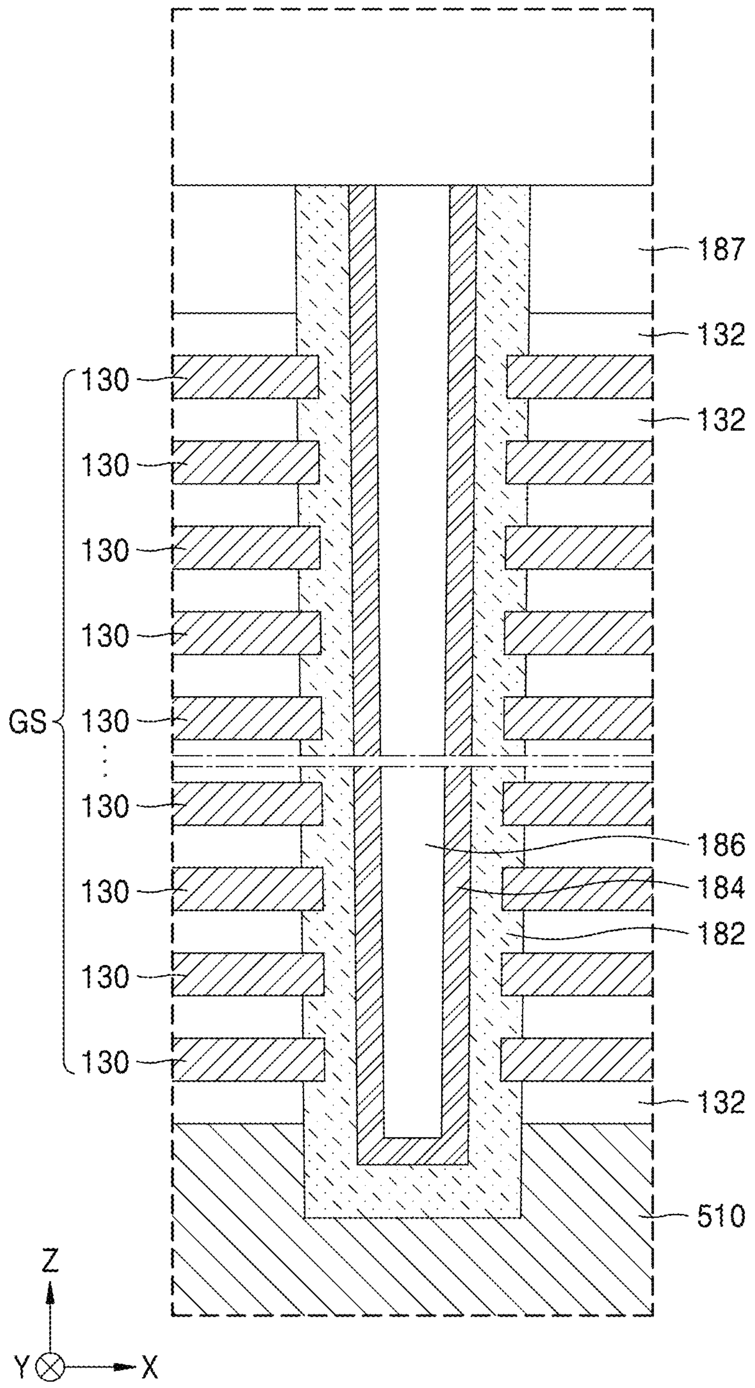

Referring to FIG. 8G, in an embodiment, in the resulting product of FIG. 8F, the plurality of gate spaces S1 are filled with the plurality of gate lines 130. As shown in FIG. 7A, the inside of each of the plurality of word line cut regions WLC is filled with the word line cut structure 192.

Figure 8H:
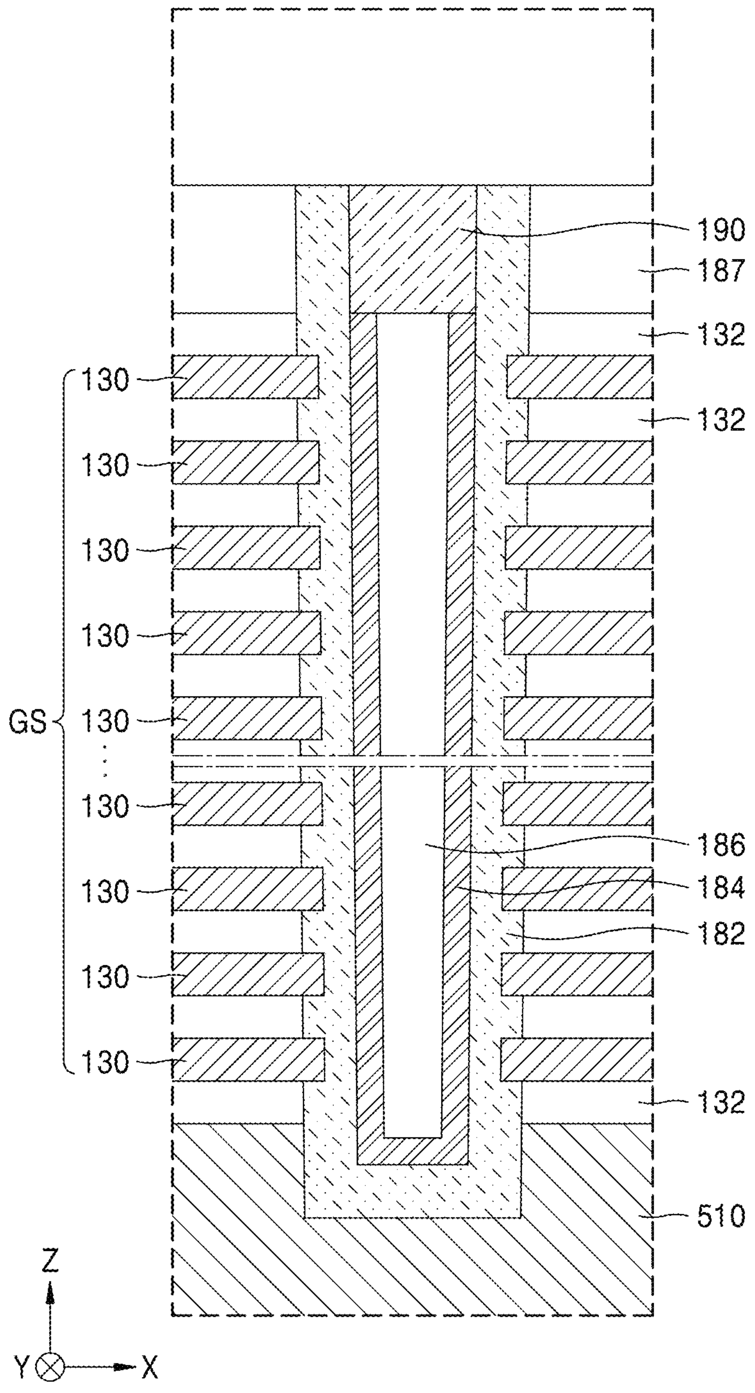

Referring to FIG. 8H, in an embodiment, a space is prepared in an upper portion of the vertical hole CHH by removing a portion of each of the channel layer 184 and the insulating plug 186 from the resulting product of FIG. 8G, and the conductive pad 190 is formed that fills the space.

Figure 8I:
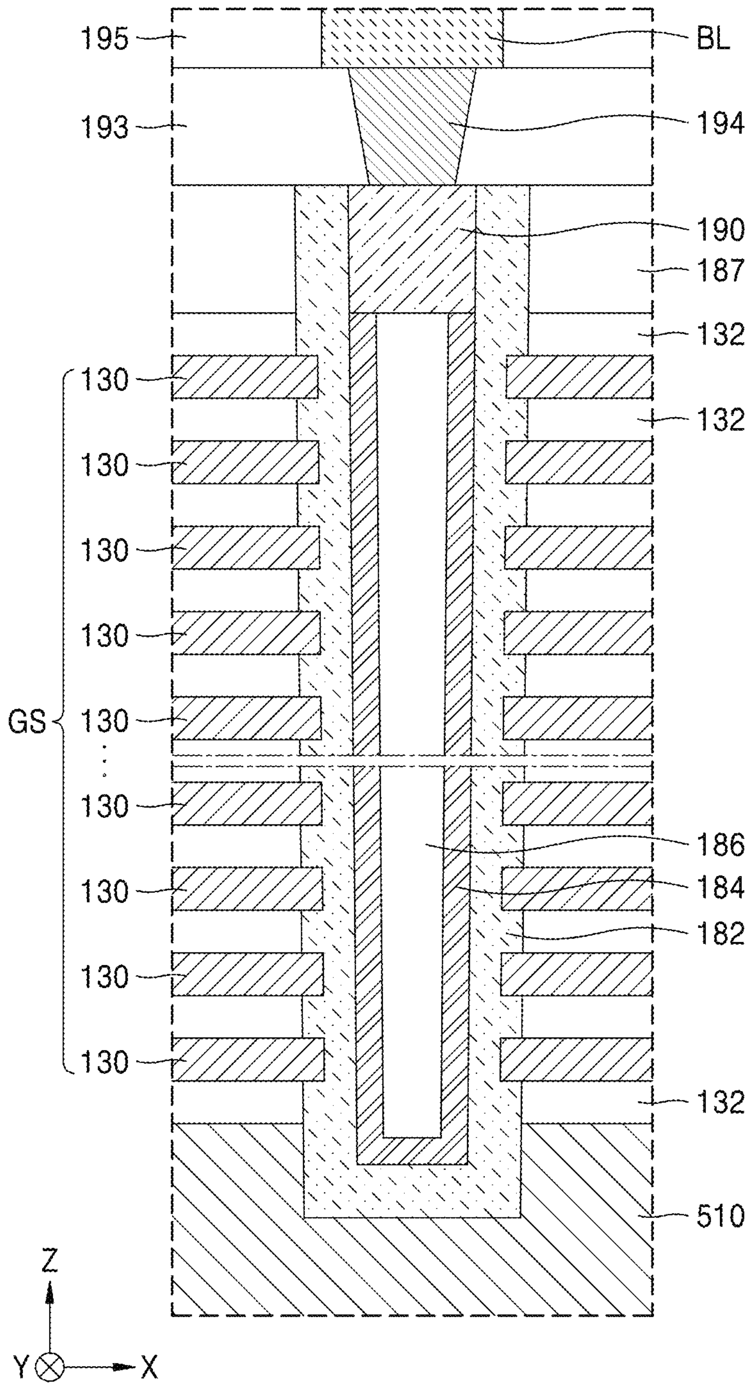

Referring to FIG. 8I, in an embodiment, the first upper insulating film 193 that covers the conductive pad 190, the hafnium oxide film 182, and the intermediate insulating film 187, the bit line contact pad 194 that passes through the first upper insulating film 193 to connect with the conductive pad 190, the second upper insulating film 195, and the bit line BL that passes through the second upper insulating film 195 to connect with the bit line contact pad 194, are formed.

Figure 8J:
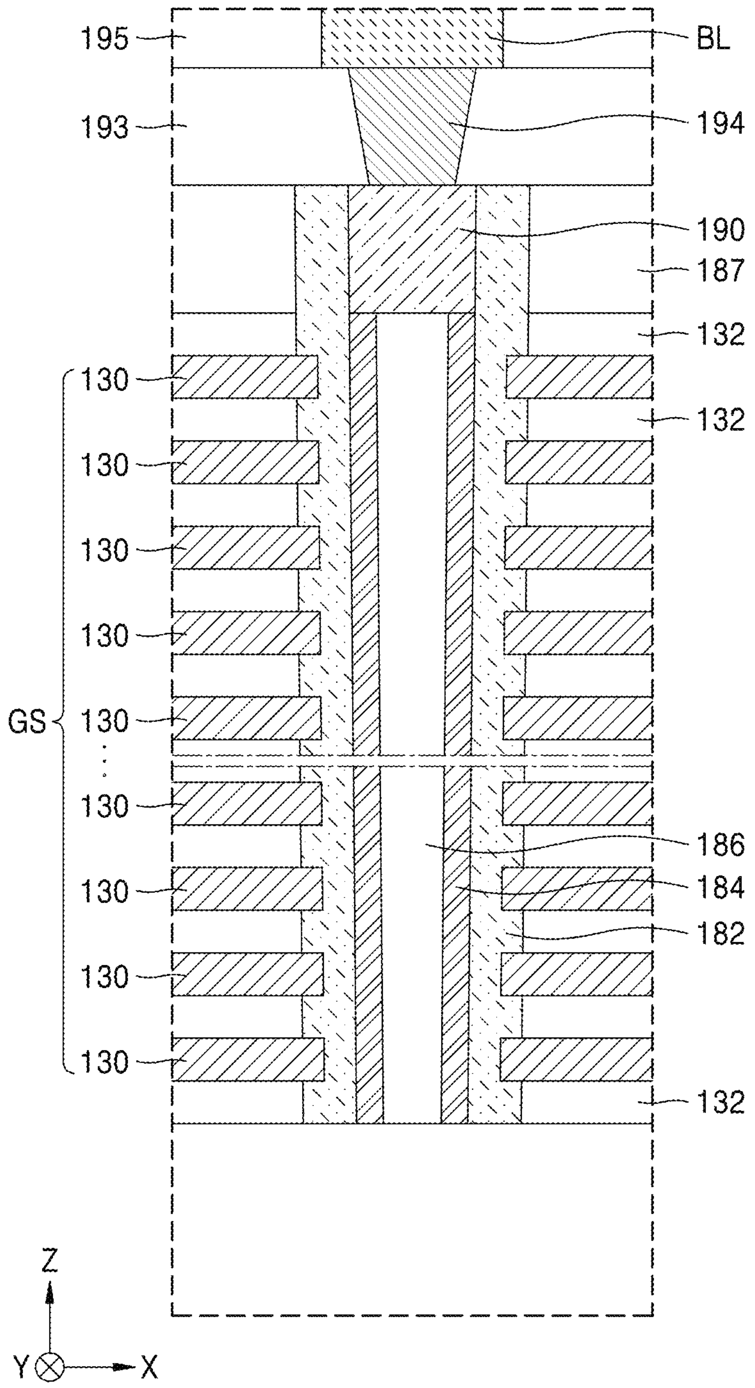

Referring to FIG. 8J, in an embodiment, a resulting product obtained by removing the substrate 510 from the resulting product of FIG. 8I, is planarized, thereby exposing the insulating film 132, the hafnium oxide film 182, the channel layer 184, and the insulating plug 186.

Figure 8K:
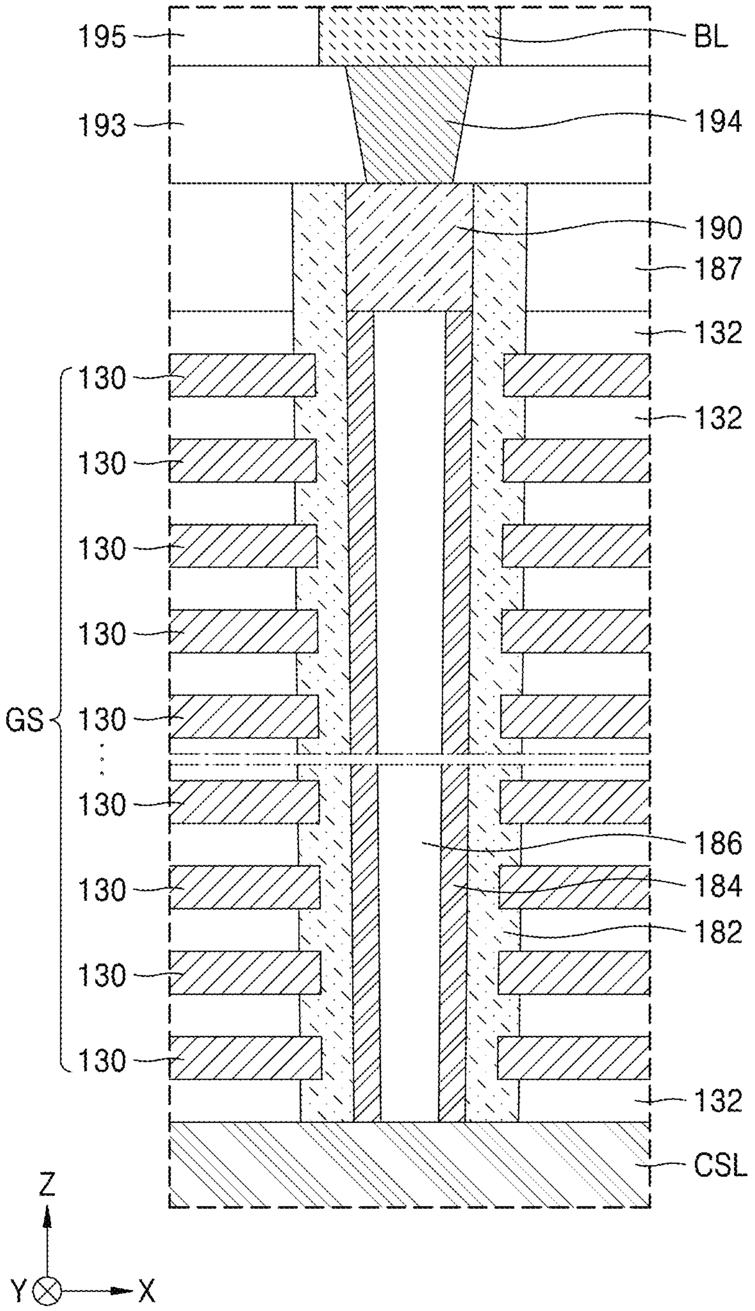

Referring to FIG. 8K, in an embodiment, in the resulting product of FIG. 8J, the common source line CSL is formed that covers the exposed surfaces of the insulating film 132, the hafnium oxide film 182, the channel layer 184, and the insulating plug 186.

According to a method of manufacturing an integrated circuit device described with reference to FIGS. 5A to 5D and 8A to 8K, according to some embodiments, the hafnium oxide film 72 or 182 is isotropically exposed to a gas mixture that includes a halogen element-containing gas and a catalytic gas that includes hydrogen atoms, in an atmosphere in which no plasma is applied onto the substrate 52 or 510, and a wet treatment is performed with an acidic solution that removes at least a portion of the component-changed surface region 72A or 182A from the hafnium oxide film 72 or 182. Therefore, even when removal-target portions of the hafnium oxide film 72 or 182 are not exposed in the uppermost region of a structure on the substrate 52 or 510 and are to be etched from the lateral surfaces thereof, the intended portions of the hafnium oxide film 72 or 182 can be etched by to a controlled thickness.

Therefore, in a method of manufacturing an integrated circuit device according to an embodiment of the inventive concept, even when components in device regions with reduced areas have complex 3-dimensional shapes and hafnium oxide films have various shapes within complex 3-dimensional structures, the hafnium oxide films can be patterned into intended shapes. Therefore, a process margin for an integrated circuit device that has a 3-dimensional structure that includes a hafnium oxide film can be secured, and the reliability of the integrated circuit device is increased.

While embodiments of the inventive concept has been particularly shown and described with reference to drawings thereof, it will be understood that various changes in form and details may be made therein without departing from the spirit and scope of the following claims.

What is claimed is:

1. A method of manufacturing an integrated circuit device, the method comprising:

forming a hafnium oxide film on a substrate; and etching a portion of the hafnium oxide film, wherein etching the portion of the hafnium oxide film comprises:

performing a dry treatment that changes components of a surface region of the hafnium oxide film by isotropically exposing the hafnium oxide film to a gas mixture, wherein the gas mixture comprises a halogen element-containing gas and a catalytic gas that includes hydrogen atoms, in an atmosphere in which no plasma is applied onto the substrate, wherein the surface region extends from an exposed surface of the hafnium oxide film into the hafnium oxide film by as much as a predetermined thickness;

performing a wet treatment with an acidic solution that removes at least a portion of the component-changed surface region from the hafnium oxide film; and repeating a sequence of the dry treatment and the wet treatment.

2. The method of claim 1, wherein the halogen element-containing gas of the dry treatment comprises fluorine (F) atoms or chlorine (Cl) atoms.

3. The method of claim 1, wherein the halogen element-containing gas of the dry treatment comprises HF gas or F radicals.

4. The method of claim 1, wherein the catalytic gas of the dry treatment comprises one of $NH_3$, $H_2O$, ethanol, isopropyl alcohol, or a combination thereof.

5. The method of claim 1, wherein the acidic solution of the wet treatment comprises one of diluted HF (DHF), a sulfuric acid peroxide mixture (SPM), diluted HCl, or a combination thereof.

6. The method of claim 1, wherein the dry treatment is performed at a first temperature in a range of about 40° C. to about 120° C., and the wet treatment is performed at a second temperature in a range of about 10° C. to about 70° C. and lower than the first temperature.

7. The method of claim 1, wherein the dry treatment comprises:

pre-treating the exposed surface of the hafnium oxide film by using the catalytic gas;

exposing the hafnium oxide film to the gas mixture;

heat-treating the hafnium oxide film;

purging an atmosphere in a reaction chamber in which the substrate is arranged after heat-treating the hafnium oxide film; and discharging by-products and gases from the reaction chamber by pumping out the purged atmosphere.

8. The method of claim 7, wherein heat-treating the hafnium oxide film is performed at a temperature in a range of about 100° C. to about 200° C.

9. The method of claim 1, wherein a thickness of the surface region removed from the hafnium oxide film during the wet treatment is about 0.1 Å to about 20 Å from the exposed surface of the hafnium oxide film.

10. A method of manufacturing an integrated circuit device, the method comprising:

forming, on a substrate, a stack structure that includes a plurality of hafnium oxide films and a plurality of intermediate films that are alternately arranged in a vertical direction;

forming an opening that passes through the stack structure in the vertical direction; and etching a portion of each of the plurality of hafnium oxide films exposed by the opening, wherein etching the portion of each of the plurality of hafnium oxide films comprises:

performing a dry treatment that changes components of a surface region of each of the plurality of hafnium oxide films by isotropically exposing each of the plurality of hafnium oxide films exposed by the opening to a gas mixture, wherein the gas mixture includes a halogen element-containing gas and a catalytic gas that includes hydrogen atoms, in an atmosphere in which no plasma is applied onto the substrate, wherein the surface region extends from an exposed surface of each of the plurality of hafnium oxide films into each of the plurality of hafnium oxide films by as much as a predetermined thickness;

performing a wet treatment with an acidic solution that removes at least a portion of the component-changed surface region from each of the plurality of hafnium oxide films; and forming an indent space that extends in a horizontal direction between the plurality of intermediate films and is connected with the opening, by repeating a sequence of the dry treatment and the wet treatment.

11. The method of claim 10, wherein the halogen element-containing gas of the dry treatment comprises one of HF gas or F radicals.

12. The method of claim 10, wherein the catalytic gas of the dry treatment comprises one of $NH_3$, $H_2O$, ethanol, isopropyl alcohol, or a combination thereof.

13. The method of claim 10, wherein the acidic solution of the wet treatment comprises one of diluted HF (DHF), a sulfuric acid peroxide mixture (SPM), diluted HCl, or a combination thereof.

14. The method of claim 10, wherein the dry treatment comprises:

pre-treating the exposed surface of each of the plurality of hafnium oxide films by using the catalytic gas;

exposing each of the plurality of hafnium oxide films to the gas mixture;

heat-treating each of the plurality of hafnium oxide films;

purging an atmosphere in a reaction chamber in which the substrate is arranged, after heat-treating each of the plurality of hafnium oxide films; and discharging by-products and gases from the reaction chamber by pumping out the purged atmosphere.

15. The method of claim 10, wherein the thickness of the surface region removed from each of the plurality of hafnium oxide films during the wet treatment is about 0.1 Å to about 20 Å from the exposed surface of each of the plurality of hafnium oxide films.

16. A method of manufacturing an integrated circuit device, the method comprising:

alternately stacking a plurality of insulating films and a plurality of sacrificial insulating films on a substrate;

forming a vertical hole that extends in a vertical direction through the plurality of insulating films and the plurality of sacrificial insulating films to;

sequentially forming a hafnium oxide film, a channel layer, and an insulating plug on exposed surfaces in the vertical hole;

forming a plurality of gate spaces by removing the plurality of sacrificial insulating films;

etching portions of the hafnium oxide film through the plurality of gate spaces such that each of the plurality of gate spaces is expanded in a horizontal direction; and forming a plurality of gate lines that fill the plurality of gate spaces, wherein etching the portions of the hafnium oxide film comprises:

performing a dry treatment that changes components of a surface region of the hafnium oxide film by isotropically exposing the hafnium oxide film to a gas mixture, wherein the gas mixture includes a halogen element-containing gas and a catalytic gas that includes hydrogen atoms in an atmosphere in which no plasma is applied onto the substrate, wherein the surface region extends from an exposed surface of the hafnium oxide film into the hafnium oxide film by as much as a predetermined thickness;

performing a wet treatment using an acidic solution that removes at least a portion of the component-changed surface region from the hafnium oxide film; and repeating a sequence of the dry treatment and the wet treatment.

17. The method of claim 16, wherein the halogen element-containing gas of the dry treatment comprises one of HF gas or F radicals, and the catalytic gas of the dry treatment comprises one of $NH_3$, $H_2O$, ethanol, isopropyl alcohol, or a combination thereof.

18. The method of claim 16, wherein the acidic solution of the wet treatment comprises one of diluted HF (DHF), a sulfuric acid peroxide mixture (SPM), diluted HCl, or a combination thereof.

19. The method of claim 16, wherein the dry treatment comprises:

pre-treating the exposed surface of the hafnium oxide film by using the catalytic gas;

exposing the hafnium oxide film to the gas mixture;

heat-treating the hafnium oxide film;

purging an atmosphere in a reaction chamber in which the substrate is arranged, after heat-treating the hafnium oxide film; and discharging by-products and gases from the reaction chamber by pumping out the purged atmosphere.

20. The method of claim 16, wherein the thickness of the surface region removed during the wet treatment from the hafnium oxide film through the plurality of gate spaces is about 0.1 Å to about 20 Å from the exposed surface of the hafnium oxide film.

* * * * *